United States Patent
Salo, III et al.

(10) Patent No.: US 11,513,160 B2
(45) Date of Patent: Nov. 29, 2022

(54) VEHICLE BATTERY MAINTENANCE DEVICE

(71) Applicants: Midtronics, Inc., Willowbrook, IL (US); Interstate Battery System International, Inc., Dallas, TX (US)

(72) Inventors: Andrew John Salo, III, Chicago, IL (US); Paul Lacroix, Chicago, IL (US); Brian Paul Madeley, Dallas, TX (US); Clifford Evyn Sewing, Colleyville, TX (US)

(73) Assignees: MIDTRONICS, INC., Willowbrook, IL (US); INTERSTATE BATTERY SYSTEM INTERNATIONAL, INC., Dallas, TX (US)

( * ) Notice: Subject to any disclaimer, the term of this patent is extended or adjusted under 35 U.S.C. 154(b) by 340 days.

(21) Appl. No.: 16/695,705

(22) Filed: Nov. 26, 2019

(65) Prior Publication Data

US 2020/0174078 A1 Jun. 4, 2020

Related U.S. Application Data

(60) Provisional application No. 62/772,882, filed on Nov. 29, 2018.

(51) Int. Cl.
*G01R 31/385* (2019.01)
*G07C 5/08* (2006.01)

(52) U.S. Cl.
CPC ......... *G01R 31/385* (2019.01); *G07C 5/0808* (2013.01); *G07C 5/0841* (2013.01)

(58) Field of Classification Search
CPC .. G01R 31/385; G07C 5/0808; G07C 5/0841; G07C 2205/02
See application file for complete search history.

(56) References Cited

U.S. PATENT DOCUMENTS

| | | | |
|---|---|---|---|
| 85,553 A | 1/1869 | Adams | 33/472 |
| 2,000,665 A | 5/1935 | Neal | 439/440 |
| 2,254,846 A | 9/1941 | Heyer | 324/437 |
| 2,417,940 A | 3/1947 | Lehman | 200/61.25 |
| 2,437,772 A | 3/1948 | Wall | 324/523 |

(Continued)

FOREIGN PATENT DOCUMENTS

| CN | 2470964 Y | 1/2002 |
|---|---|---|
| CN | 201063352 Y | 5/2008 |

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner* — Sizo B Vilakazi
(74) *Attorney, Agent, or Firm* — Westman, Champlin & Koehler, P.A.

(57) ABSTRACT

An electronic battery tester or battery charger for testing or charging a storage battery including electrical connectors configured to electrically couple to a terminals of the storage battery. Circuitry couples to the electrical connectors and is configured to test or charge the storage battery. An input signal is received related to a battery which is suitable for use with the vehicle.

13 Claims, 5 Drawing Sheets

(56) References Cited

U.S. PATENT DOCUMENTS

| | | | |
|---|---|---|---|
| 2,514,745 A | 7/1950 | Dalzell | 324/115 |
| 2,727,221 A | 12/1955 | Springg | 340/447 |
| 3,025,455 A | 3/1962 | Jonsson | 323/369 |
| 3,178,686 A | 4/1965 | Mills | 340/447 |
| 3,215,194 A | 11/1965 | Sununu et al. | 165/80.3 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,699,433 A | 10/1972 | Smith, Jr. | 324/523 |
| 3,704,439 A | 11/1972 | Nelson | |
| 3,729,989 A | 5/1973 | Little | 73/862.192 |
| 3,745,441 A | 7/1973 | Soffer | 290/14 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 2,689,939 A | 4/1974 | Godshalk | |
| 3,808,401 A | 4/1974 | Wright et al. | |
| 3,808,522 A | 4/1974 | Sharaf | 324/430 |
| 3,808,573 A | 4/1974 | Cappell | |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,857,082 A | 12/1974 | Van Opijnen | 320/143 |
| 3,873,911 A | 3/1975 | Champlin | 324/430 |
| 3,876,931 A | 4/1975 | Godshalk | 324/429 |
| 3,879,654 A | 4/1975 | Kessinger | 324/434 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,920,284 A | 11/1975 | Lane et al. | 303/122.06 |
| 3,936,744 A | 2/1976 | Perlmutter | 324/772 |
| 3,939,400 A | 2/1976 | Steele | 324/434 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,176,315 A | 11/1979 | Sunnarborg | 324/133 |
| 4,178,546 A | 12/1979 | Hulls et al. | 324/772 |
| 4,193,025 A | 3/1980 | Frailing et al. | 324/427 |
| 4,207,610 A | 6/1980 | Gordon | 701/33.9 |
| 4,207,611 A | 6/1980 | Gordon | 701/33 |
| 4,217,645 A | 8/1980 | Barry et al. | 702/63 |
| 4,218,745 A | 8/1980 | Perkins | 324/66 |
| 4,280,457 A | 7/1981 | Bloxham | 123/198 R |
| 4,295,468 A | 10/1981 | Bartelt | |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 6/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,425,791 A | 1/1984 | Kling | 73/116.02 |
| 4,441,359 A | 4/1984 | Ezoe | 73/116.06 |
| 4,459,548 A | 7/1984 | Lentz et al. | 324/472 |
| 4,502,000 A | 2/1985 | Mashikian | |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,544,312 A | 10/1985 | Stencel | |
| 4,560,230 A | 12/1985 | Inglis | 439/890 |
| 4,564,798 A | 1/1986 | Young | 320/103 |
| 4,620,767 A | 11/1986 | Woolf | 439/217 |
| 4,626,765 A | 12/1986 | Tanaka | 320/127 |
| 4,633,418 A | 12/1986 | Bishop | 702/63 |
| 4,637,359 A | 1/1987 | Cook | 123/179 |
| 4,643,511 A | 2/1987 | Gawlik | 439/755 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| D299,909 S | 2/1989 | Casey | D10/77 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,826,457 A | 5/1989 | Varatta | 439/504 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koenck | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |

(56) References Cited

U.S. PATENT DOCUMENTS

| | | | |
|---|---|---|---|
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,335 A | 8/1991 | Campbell | 439/217 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,083,076 A | 1/1992 | Scott | 320/105 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| D330,338 S | 10/1992 | Wang | D10/77 |
| 5,159,272 A | 10/1992 | Rao et al. | 324/429 |
| 5,160,881 A | 11/1992 | Schramm et al. | 322/7 |
| 5,164,653 A | 11/1992 | Reem | |
| 5,167,529 A | 12/1992 | Verge | 427/1 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,187,382 A | 2/1993 | Kondo | 307/10.1 |
| 5,194,799 A | 3/1993 | Tomantschger | 320/103 |
| 5,202,617 A | 4/1993 | Nor | |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,223,747 A | 6/1993 | Tschulena | 257/713 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,296,823 A | 3/1994 | Dietrich | 333/161 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,309,052 A | 5/1994 | Kim | 74/350 |
| 5,313,152 A | 5/1994 | Wozniak et al. | 320/118 |
| 5,315,287 A | 5/1994 | Sol | 340/455 |
| 5,321,231 A | 6/1994 | Schmalzriedt et al. | |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,345,384 A | 9/1994 | Przybyla et al. | 701/29.1 |
| 5,347,163 A | 9/1994 | Yoshimura | 307/66 |
| 5,349,535 A | 9/1994 | Gupta | 320/106 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/136 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,384,540 A | 1/1995 | Dessel | 324/539 |
| 5,387,871 A | 2/1995 | Tsai | 324/429 |
| 5,394,093 A | 2/1995 | Cervas | 324/556 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 29/65 |
| 5,432,426 A | 7/1995 | Yoshida | 320/160 |
| 5,432,429 A | 7/1995 | Armstrong | |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,462,439 A | 10/1995 | Keith | 180/279 |
| 5,469,043 A | 11/1995 | Cherng et al. | 320/161 |
| 5,485,090 A | 1/1996 | Stephens | 324/433 |
| 5,486,123 A | 1/1996 | Miyazaki | 439/825 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,555,498 A | 9/1996 | Berra | |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,292 A | 12/1996 | Rozon | |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,631,536 A | 5/1997 | Tseng | 320/15 |
| 5,631,831 A | 5/1997 | Bird et al. | 701/34.4 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,644,212 A | 7/1997 | Takahashi | 320/134 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,685,734 A | 11/1997 | Kutz | 439/371 |
| 5,691,621 A | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |

(56) References Cited

U.S. PATENT DOCUMENTS

| | | |
|---|---|---|
| 5,711,648 A | 1/1998 | Hammerslag ............... 414/800 |
| 5,712,795 A | 1/1998 | Layman et al. ............. 700/297 |
| 5,717,336 A | 2/1998 | Basell et al. ................ 324/430 |
| 5,717,937 A | 2/1998 | Fritz ........................... 713/300 |
| 5,721,688 A | 2/1998 | Bramwell .................... 324/426 |
| 5,732,074 A | 3/1998 | Spaur et al. ................. 370/313 |
| 5,739,667 A | 4/1998 | Matsuda et al. ............. 320/128 |
| 5,744,962 A | 4/1998 | Alber et al. ................. 324/426 |
| 5,745,044 A | 4/1998 | Hyatt, Jr. et al. ........... 340/5.23 |
| 5,747,189 A | 5/1998 | Perkins ......................... 429/91 |
| 5,747,909 A | 5/1998 | Syverson et al. ........ 310/156.56 |
| 5,747,967 A | 5/1998 | Muljadi et al. .............. 320/148 |
| 5,754,417 A | 5/1998 | Nicollini ........................ 363/60 |
| 5,757,192 A | 5/1998 | McShane et al. ........... 324/427 |
| 5,760,587 A | 6/1998 | Harvey ........................ 324/434 |
| 5,772,468 A | 6/1998 | Kowalski et al. ............ 439/506 |
| 5,773,962 A | 6/1998 | Nor .............................. 20/134 |
| 5,773,978 A | 6/1998 | Becker ........................ 324/430 |
| 5,778,326 A | 7/1998 | Moroto et al. ................ 701/22 |
| 5,780,974 A | 7/1998 | Pabla et al. ................... 315/82 |
| 5,780,980 A | 7/1998 | Naito ........................... 318/139 |
| 5,789,899 A | 8/1998 | van Phuoc et al. .......... 320/112 |
| 5,793,359 A | 8/1998 | Ushikubo .................... 345/169 |
| 5,796,239 A | 8/1998 | van Phuoc et al. .......... 320/107 |
| 5,808,469 A | 9/1998 | Kopera ........................ 324/434 |
| 5,811,979 A | 9/1998 | Rhein .......................... 324/718 |
| 5,818,201 A | 10/1998 | Stockstad et al. ............ 320/119 |
| 5,818,234 A | 10/1998 | McKinnon ................... 324/433 |
| 5,820,407 A | 10/1998 | Morse et al. ................. 439/504 |
| 5,821,756 A | 10/1998 | McShane et al. ........... 324/430 |
| 5,821,757 A | 10/1998 | Alvarez et al. .............. 324/434 |
| 5,825,174 A | 10/1998 | Parker ......................... 324/106 |
| 5,826,467 A | 10/1998 | Huang |
| 5,831,435 A | 11/1998 | Troy ........................... 324/426 |
| 5,832,396 A | 11/1998 | Moroto et al. ................ 701/22 |
| 5,850,113 A | 12/1998 | Weimer et al. ............ 307/10.1 |
| 5,862,515 A | 1/1999 | Kobayashi et al. ............ 702/63 |
| 5,865,638 A | 2/1999 | Trafton ........................ 439/288 |
| 5,869,951 A | 2/1999 | Takahashi ................... 320/104 |
| 5,870,018 A | 2/1999 | Person ........................ 307/10.2 |
| 5,871,858 A | 2/1999 | Thomsen et al. ................ 429/7 |
| 5,872,443 A | 2/1999 | Williamson ................. 320/160 |
| 5,872,453 A | 2/1999 | Shimoyama et al. ........ 324/431 |
| 5,883,306 A | 3/1999 | Hwang ....................... 73/146.8 |
| 5,884,202 A | 3/1999 | Arjomand ................... 701/31.4 |
| 5,895,440 A | 4/1999 | Proctor et al. ................. 702/63 |
| 5,903,154 A | 5/1999 | Zhang et al. ................ 324/437 |
| 5,903,716 A | 5/1999 | Kimber et al. ............... 395/114 |
| 5,912,534 A | 6/1999 | Benedict ....................... 315/82 |
| 5,914,605 A | 6/1999 | Bertness ..................... 324/430 |
| 5,916,287 A | 6/1999 | Arjomand et al. .......... 701/33.2 |
| 5,927,938 A | 7/1999 | Hammerslag ............... 414/809 |
| 5,929,609 A | 7/1999 | Joy et al. ...................... 322/25 |
| 5,935,180 A | 8/1999 | Fieramosca et al. ........ 701/29.6 |
| 5,939,855 A | 8/1999 | Proctor et al. ............... 320/104 |
| 5,939,861 A | 8/1999 | Joko et al. ................... 320/122 |
| 5,945,829 A | 8/1999 | Bertness ..................... 324/430 |
| 5,946,605 A | 8/1999 | Takahisa et al. .............. 455/68 |
| 5,950,144 A | 9/1999 | Hall et al. .................... 702/108 |
| 5,951,229 A | 9/1999 | Hammerslag ............... 414/398 |
| 5,953,322 A | 9/1999 | Kimball ...................... 370/328 |
| 5,955,951 A | 9/1999 | Wischerop et al. ........ 340/572.8 |
| 5,961,561 A | 10/1999 | Wakefield, II ................. 701/29 |
| 5,961,604 A | 10/1999 | Anderson et al. ............ 709/229 |
| 5,963,012 A | 10/1999 | Garcia et al. ................ 320/106 |
| 5,969,625 A | 10/1999 | Russo ....................... 340/636.19 |
| 5,973,598 A | 10/1999 | Beigel ....................... 340/572.1 |
| 5,978,805 A | 11/1999 | Carson ......................... 707/10 |
| 5,982,138 A | 11/1999 | Krieger ....................... 320/105 |
| 5,990,664 A | 11/1999 | Rahman ...................... 320/136 |
| 6,002,238 A | 12/1999 | Champlin ................... 320/134 |
| 6,005,489 A | 12/1999 | Siegle et al. ............. 340/825.69 |
| 6,005,759 A | 12/1999 | Hart et al. ...................... 361/66 |
| 6,008,652 A | 12/1999 | Theofanopoulos et al. .. 324/434 |
| 6,009,369 A | 12/1999 | Boisvert et al. ............... 701/99 |
| 6,009,742 A | 1/2000 | Balko |
| 6,016,047 A | 1/2000 | Notten et al. ................ 320/137 |
| 6,031,354 A | 2/2000 | Wiley et al. ................. 320/116 |
| 6,031,368 A | 2/2000 | Klippel et al. ............... 324/133 |
| 6,037,745 A | 3/2000 | Koike et al. ................. 320/104 |
| 6,037,749 A | 3/2000 | Parsonage ................... 320/132 |
| 6,037,751 A | 3/2000 | Klang ......................... 320/160 |
| 6,037,777 A | 3/2000 | Champlin ................... 324/430 |
| 6,037,778 A | 3/2000 | Makhija ...................... 324/433 |
| 6,046,514 A | 4/2000 | Rouillard et al. ............. 307/77 |
| 6,051,976 A | 4/2000 | Bertness ..................... 324/426 |
| 6,055,468 A | 4/2000 | Kaman et al. ................. 701/29 |
| 6,061,638 A | 5/2000 | Joyce ............................ 702/63 |
| 6,064,372 A | 5/2000 | Kahkoska .................... 345/173 |
| 6,072,299 A | 6/2000 | Kurle et al. .................. 320/112 |
| 6,072,300 A | 6/2000 | Tsuji ........................... 320/116 |
| 6,075,339 A | 6/2000 | Reipur et al. ................ 320/110 |
| 6,081,098 A | 6/2000 | Bertness et al. ............. 320/134 |
| 6,081,109 A | 6/2000 | Seymour et al. ............ 324/127 |
| 6,081,154 A | 6/2000 | Ezell et al. .................. 327/540 |
| 6,087,815 A | 7/2000 | Pfeifer et al. ............... 323/282 |
| 6,091,238 A | 7/2000 | McDermott .............. 324/207.2 |
| 6,091,245 A | 7/2000 | Bertness ..................... 324/426 |
| 6,094,033 A | 7/2000 | Ding et al. .................. 320/132 |
| 6,097,193 A | 8/2000 | Bramwell .................... 324/429 |
| 6,100,670 A | 8/2000 | Levesque .................... 320/150 |
| 6,100,815 A | 8/2000 | Pailthorp ................. 324/754.07 |
| 6,104,167 A | 8/2000 | Bertness et al. ............. 320/132 |
| 6,113,262 A | 9/2000 | Purola et al. .................. 374/45 |
| 6,114,834 A | 9/2000 | Parise .......................... 320/109 |
| 6,118,252 A | 9/2000 | Richter |
| 6,121,880 A | 9/2000 | Scott et al. ................ 340/572.5 |
| 6,130,519 A | 10/2000 | Whiting et al. |
| 6,136,914 A | 10/2000 | Hergenrother et al. ...... 524/495 |
| 6,137,261 A | 10/2000 | Kurle et al. |
| 6,137,269 A | 10/2000 | Champlin ................... 320/150 |
| 6,140,797 A | 10/2000 | Dunn .......................... 320/105 |
| 6,141,608 A | 10/2000 | Rother ........................ 701/29.6 |
| 6,144,185 A | 11/2000 | Dougherty et al. .......... 320/132 |
| 6,147,598 A | 11/2000 | Murphy et al. .......... 340/426.19 |
| 6,149,653 A | 11/2000 | Deslauriers ................. 606/232 |
| 6,150,793 A | 11/2000 | Lesesky et al. ............. 320/104 |
| 6,158,000 A | 12/2000 | Collins ......................... 713/1 |
| 6,161,640 A | 12/2000 | Yamaguchi ................ 180/65.8 |
| 6,163,156 A | 12/2000 | Bertness ..................... 324/426 |
| 6,164,063 A | 12/2000 | Mendler ........................ 60/274 |
| 6,167,349 A | 12/2000 | Alvarez ......................... 702/63 |
| 6,172,483 B1 | 1/2001 | Champlin ................... 320/134 |
| 6,172,505 B1 | 1/2001 | Bertness ..................... 324/430 |
| 6,177,737 B1 | 1/2001 | Palfey et al. .................. 307/64 |
| 6,177,878 B1 | 1/2001 | Tamura |
| 6,181,545 B1 | 1/2001 | Amatucci et al. ............ 361/502 |
| 6,184,655 B1 | 2/2001 | Malackowski ............... 320/116 |
| 6,184,656 B1 | 2/2001 | Karunasiri et al. .......... 320/119 |
| 6,191,557 B1 | 2/2001 | Gray et al. .................. 320/132 |
| 6,202,739 B1 | 3/2001 | Pal et al. .................. 165/104.33 |
| 6,211,651 B1 | 4/2001 | Nemoto ....................... 320/133 |
| 6,211,653 B1 | 4/2001 | Stasko ........................ 320/132 |
| 6,215,275 B1 | 4/2001 | Bean ........................... 320/106 |
| 6,218,805 B1 | 4/2001 | Melcher ...................... 320/105 |
| 6,218,936 B1 | 4/2001 | Imao ........................... 340/447 |
| 6,222,342 B1 | 4/2001 | Eggert et al. ................ 320/105 |
| 6,222,369 B1 | 4/2001 | Champlin ................... 324/430 |
| D442,503 S | 5/2001 | Lundbeck et al. ............. D10/77 |
| 6,225,808 B1 | 5/2001 | Varghese et al. ............ 324/426 |
| 6,225,898 B1 | 5/2001 | Kamiya et al. .............. 340/505 |
| 6,236,186 B1 | 5/2001 | Helton et al. ................ 320/106 |
| 6,236,332 B1 | 5/2001 | Conkright et al. ............ 340/3.1 |
| 6,236,949 B1 | 5/2001 | Hart .............................. 702/64 |
| 6,238,253 B1 | 5/2001 | Qualls ......................... 439/759 |
| 6,242,887 B1 | 6/2001 | Burke ......................... 320/104 |
| 6,242,921 B1 | 6/2001 | Thibedeau et al. .......... 324/429 |
| 6,249,124 B1 | 6/2001 | Bertness ..................... 324/426 |
| 6,250,973 B1 | 6/2001 | Lowery et al. .............. 439/763 |
| 6,252,942 B1 | 6/2001 | Zoiss ............................ 379/19 |
| 6,254,438 B1 | 7/2001 | Gaunt ......................... 439/755 |
| 6,255,826 B1 | 7/2001 | Ohsawa ...................... 320/116 |
| 6,259,170 B1 | 7/2001 | Limoge et al. ............. 307/10.8 |
| 6,259,254 B1 | 7/2001 | Klang ......................... 324/427 |

(56) References Cited

U.S. PATENT DOCUMENTS

| | | |
|---|---|---|
| 6,262,563 B1 | 7/2001 | Champlin .................... 320/134 |
| 6,262,692 B1 | 7/2001 | Babb ........................... 343/895 |
| 6,263,268 B1 | 7/2001 | Nathanson .................... 701/29 |
| 6,263,322 B1 | 7/2001 | Kirkevold et al. ........... 705/400 |
| 6,271,643 B1 | 8/2001 | Becker et al. ................ 320/112 |
| 6,271,748 B1 | 8/2001 | Derbyshire et al. .......... 340/442 |
| 6,272,387 B1 | 8/2001 | Yoon ............................. 700/83 |
| 6,275,008 B1 | 8/2001 | Arai et al. .................... 320/132 |
| 6,285,191 B1 | 9/2001 | Gollomp et al. ............. 324/427 |
| 6,294,896 B1 | 9/2001 | Champlin .................... 320/134 |
| 6,294,897 B1 | 9/2001 | Champlin .................... 320/153 |
| 6,304,087 B1 | 10/2001 | Bertness ...................... 324/426 |
| 6,307,349 B1 | 10/2001 | Koenck et al. ............... 320/112 |
| 6,310,481 B2 | 10/2001 | Bertness ...................... 324/430 |
| 6,313,607 B1 | 11/2001 | Champlin .................... 320/132 |
| 6,313,608 B1 | 11/2001 | Varghese et al. ............. 320/132 |
| 6,316,914 B1 | 11/2001 | Bertness ...................... 320/134 |
| 6,320,385 B1 | 11/2001 | Ng et al. ...................... 320/104 |
| 6,323,650 B1 | 11/2001 | Bertness et al. .............. 324/426 |
| 6,324,042 B1 | 11/2001 | Andrews ..................... 361/93.2 |
| 6,329,793 B1 | 12/2001 | Bertness et al. .............. 320/132 |
| 6,331,762 B1 | 12/2001 | Bertness ...................... 320/134 |
| 6,332,113 B1 | 12/2001 | Bertness ........................ 702/63 |
| 6,346,795 B2 | 2/2002 | Haraguchi et al. ........... 320/136 |
| 6,347,958 B1 | 2/2002 | Tsai .............................. 439/488 |
| 6,351,102 B1 | 2/2002 | Troy ............................. 320/139 |
| 6,356,042 B1 | 3/2002 | Kahlon et al. ................ 318/138 |
| 6,356,083 B1 | 3/2002 | Ying ............................. 324/426 |
| 6,359,441 B1 | 3/2002 | Bertness ...................... 324/426 |
| 6,359,442 B1 | 3/2002 | Henningson et al. ........ 324/426 |
| 6,363,303 B1 | 3/2002 | Bertness ........................ 701/29 |
| RE37,677 E | 4/2002 | Irie ................................ 315/83 |
| 6,377,031 B1 | 4/2002 | Karuppana et al. .......... 323/220 |
| 6,384,608 B1 | 5/2002 | Namaky ....................... 324/430 |
| 6,388,448 B1 | 5/2002 | Cervas ......................... 324/426 |
| 6,389,337 B1 | 5/2002 | Kolls ........................... 701/31.6 |
| 6,392,414 B2 | 5/2002 | Bertness ...................... 324/429 |
| 6,396,278 B1 | 5/2002 | Makhija ....................... 324/402 |
| 6,407,554 B1 | 6/2002 | Godau et al. ................ 324/503 |
| 6,411,098 B1 | 6/2002 | Laletin ......................... 324/436 |
| 6,417,669 B1 | 7/2002 | Champlin .................... 324/426 |
| 6,420,852 B1 | 7/2002 | Sato ............................. 320/134 |
| 6,424,157 B1 | 7/2002 | Gollomp et al. ............. 324/430 |
| 6,424,158 B2 | 7/2002 | Klang .......................... 324/433 |
| 6,433,512 B1 | 8/2002 | Birkler et al. ................ 320/132 |
| 6,437,957 B1 | 8/2002 | Karuppana et al. ............ 361/78 |
| 6,441,585 B1 | 8/2002 | Bertness ...................... 320/132 |
| 6,445,158 B1 | 9/2002 | Bertness et al. .............. 320/104 |
| 6,448,778 B1 | 9/2002 | Rankin ......................... 324/503 |
| 6,449,726 B1 | 9/2002 | Smith .......................... 713/340 |
| 6,456,036 B1 | 9/2002 | Thandiwe .................... 320/106 |
| 6,456,045 B1 | 9/2002 | Troy et al. .................... 320/139 |
| 6,465,908 B1 | 10/2002 | Karuppana et al. ............ 307/31 |
| 6,466,025 B1 | 10/2002 | Klang .......................... 324/429 |
| 6,466,026 B1 | 10/2002 | Champlin .................... 324/430 |
| 6,469,511 B1 | 10/2002 | Vonderhaar et al. ......... 324/425 |
| 6,473,659 B1 | 10/2002 | Shah et al. .................... 700/79 |
| 6,477,478 B1 | 11/2002 | Jones et al. .................. 702/102 |
| 6,495,990 B2 | 12/2002 | Champlin .................... 320/132 |
| 6,497,209 B1 | 12/2002 | Karuppana et al. ........ 123/179.3 |
| 6,500,025 B1 | 12/2002 | Moenkhaus et al. ......... 439/502 |
| 6,501,243 B1 | 12/2002 | Kaneko ........................ 318/139 |
| 6,505,507 B1 | 1/2003 | Imao ........................... 73/146.5 |
| 6,507,196 B2 | 1/2003 | Thomsen et al. ............. 324/436 |
| 6,526,361 B1 | 2/2003 | Jones et al. .................... 702/63 |
| 6,529,723 B1 | 3/2003 | Bentley ........................ 455/405 |
| 6,531,847 B1 | 3/2003 | Tsukamoto et al. |
| 6,531,848 B1 | 3/2003 | Chitsazan et al. ............ 320/153 |
| 6,532,425 B1 | 3/2003 | Boost et al. ................... 702/63 |
| 6,533,316 B2 | 3/2003 | Breed et al. .................. 280/735 |
| 6,534,992 B2 | 3/2003 | Meissner et al. ............. 324/426 |
| 6,534,993 B2 | 3/2003 | Bertness ...................... 324/433 |
| 6,536,536 B1 | 3/2003 | Gass et al. ...................... 173/2 |
| 6,544,078 B2 | 4/2003 | Palmisano et al. ........... 439/762 |
| 6,545,599 B2 | 4/2003 | Derbyshire et al. .......... 340/442 |
| 6,556,019 B2 | 4/2003 | Bertness ...................... 324/426 |
| 6,566,883 B1 | 5/2003 | Vonderhaar et al. ......... 324/426 |
| 6,570,385 B1 | 5/2003 | Roberts et al. ............... 324/378 |
| 6,573,685 B2 | 6/2003 | Nakanishi et al. |
| 6,577,107 B2 | 6/2003 | Kechmire .................... 320/139 |
| 6,586,941 B2 | 7/2003 | Bertness et al. .............. 324/426 |
| 6,597,150 B1 | 7/2003 | Bertness et al. .............. 320/104 |
| 6,599,243 B2 | 7/2003 | Woltermann et al. ........ 600/300 |
| 6,600,815 B1 | 7/2003 | Walding ..................... 379/93.07 |
| 6,611,740 B2 | 8/2003 | Lowrey et al. ................ 701/29 |
| 6,614,349 B1 | 9/2003 | Proctor et al. .............. 340/572.1 |
| 6,618,644 B2 | 9/2003 | Bean ............................. 700/231 |
| 6,621,272 B2 | 9/2003 | Champlin .................... 324/426 |
| 6,623,314 B1 | 9/2003 | Cox et al. .................... 439/759 |
| 6,624,635 B1 | 9/2003 | Lui ................................ 24/426 |
| 6,628,011 B2 | 9/2003 | Droppo et al. ................ 307/43 |
| 6,629,054 B2 | 9/2003 | Makhija et al. .............. 702/113 |
| 6,633,165 B2 | 10/2003 | Bertness ...................... 324/426 |
| 6,635,974 B1 | 10/2003 | Karuppana et al. .......... 307/140 |
| 6,636,790 B1 | 10/2003 | Lightner et al. ............. 701/31.5 |
| 6,667,624 B1 | 12/2003 | Raichle et al. ............... 324/522 |
| 6,679,212 B2 | 1/2004 | Kelling ..................... 123/179.28 |
| 6,686,542 B2 | 2/2004 | Zhang ............................ 174/74 |
| 6,696,819 B2 | 2/2004 | Bertness ...................... 320/134 |
| 6,707,303 B2 | 3/2004 | Bertness et al. .............. 324/426 |
| 6,732,031 B1 | 5/2004 | Lightner et al. ............. 701/31.4 |
| 6,736,941 B2 | 5/2004 | Oku et al. ...................... 203/68 |
| 6,737,831 B2 | 5/2004 | Champlin .................... 320/132 |
| 6,738,697 B2 | 5/2004 | Breed ............................ 701/29 |
| 6,740,990 B2 | 5/2004 | Tozuka et al. ................ 307/9.1 |
| 6,744,149 B1 | 6/2004 | Karuppana et al. ............ 307/31 |
| 6,745,153 B2 | 6/2004 | White et al. .................. 702/184 |
| 6,759,849 B2 | 7/2004 | Bertness ...................... 324/426 |
| 6,771,073 B2 | 8/2004 | Henningson et al. ........ 324/426 |
| 6,777,945 B2 | 8/2004 | Roberts et al. ............... 324/426 |
| 6,781,344 B1 | 8/2004 | Hedegor et al. ............. 320/106 |
| 6,781,382 B2 | 8/2004 | Johnson ....................... 324/426 |
| 6,784,635 B2 | 8/2004 | Larson ......................... 320/104 |
| 6,784,637 B2 | 8/2004 | Raichle et al. ............... 320/107 |
| 6,788,025 B2 | 9/2004 | Bertness et al. .............. 320/104 |
| 6,795,782 B2 | 9/2004 | Bertness et al. ................ 702/63 |
| 6,796,841 B1 | 9/2004 | Cheng et al. ............... 439/620.3 |
| 6,805,090 B2 | 10/2004 | Bertness et al. .............. 123/198 |
| 6,806,716 B2 | 10/2004 | Bertness et al. .............. 324/426 |
| 6,825,669 B2 | 11/2004 | Raichle et al. ............... 324/426 |
| 6,832,141 B2 | 12/2004 | Skeen et al. ................. 701/31.4 |
| 6,842,707 B2 | 1/2005 | Raichle et al. ................. 702/62 |
| 6,845,279 B1 | 1/2005 | Gilmore et al. .............. 700/115 |
| 6,850,037 B2 | 2/2005 | Bertness ...................... 320/132 |
| 6,856,162 B1 | 2/2005 | Greatorex et al. ........ 324/764.01 |
| 6,856,972 B1 | 2/2005 | Yun et al. ................... 705/36 R |
| 6,871,151 B2 | 3/2005 | Bertness ........................ 702/63 |
| 6,885,195 B2 | 4/2005 | Bertness ...................... 324/426 |
| 6,888,468 B2 | 5/2005 | Bertness .................... 340/636.15 |
| 6,891,378 B2 | 5/2005 | Bertness et al. .............. 324/426 |
| 6,895,809 B2 | 5/2005 | Raichle .......................... 73/119 |
| 6,904,796 B2 | 6/2005 | Pacsai et al. ................. 73/146.8 |
| 6,906,522 B2 | 6/2005 | Bertness et al. .............. 324/426 |
| 6,906,523 B2 | 6/2005 | Bertness et al. .............. 324/426 |
| 6,906,624 B2 | 6/2005 | McClelland et al. ......... 340/442 |
| 6,909,287 B2 | 6/2005 | Bertness ...................... 324/427 |
| 6,909,356 B2 | 6/2005 | Brown et al. ................. 340/3.2 |
| 6,911,825 B2 | 6/2005 | Namaky ....................... 324/426 |
| 6,913,483 B2 | 7/2005 | Restaino et al. .............. 439/504 |
| 6,914,413 B2 | 7/2005 | Bertness et al. .............. 320/104 |
| 6,919,725 B2 | 7/2005 | Bertness et al. .............. 324/433 |
| 6,930,485 B2 | 8/2005 | Bertness et al. .............. 324/426 |
| 6,933,727 B2 | 8/2005 | Bertness et al. .............. 324/426 |
| 6,941,234 B2 | 9/2005 | Bertness et al. ................ 702/63 |
| 6,957,133 B1 | 10/2005 | Hunt et al. ................... 701/32.4 |
| 6,961,445 B1 | 11/2005 | Jensen et al. |
| 6,966,676 B2 | 11/2005 | Chabert et al. |
| 6,967,484 B2 | 11/2005 | Bertness ...................... 324/426 |
| 6,972,662 B1 | 12/2005 | Ohkawa et al. .............. 340/10.1 |
| 6,983,212 B2 | 1/2006 | Burns ............................ 702/63 |
| 6,988,053 B2 | 1/2006 | Namaky ....................... 320/104 |
| 6,993,421 B2 | 1/2006 | Pillar et al. .................. 701/29.4 |
| 6,998,847 B2 | 2/2006 | Bertness et al. .............. 324/426 |
| 7,003,410 B2 | 2/2006 | Bertness et al. ................ 702/63 |

(56) References Cited

U.S. PATENT DOCUMENTS

| | | | |
|---|---|---|---|
| 7,003,411 B2 | 2/2006 | Bertness | 702/63 |
| 7,012,433 B2 | 3/2006 | Smith et al. | 324/426 |
| 7,015,674 B2 | 3/2006 | VonderHaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,042,346 B2 | 5/2006 | Paulsen | 340/438 |
| 7,049,822 B2 | 5/2006 | Kung | 324/426 |
| 7,058,525 B2 | 6/2006 | Bertness et al. | 702/63 |
| 7,069,979 B2 | 7/2006 | Tobias | 165/104.33 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,170,393 B2 | 1/2007 | Martin | 340/10.1 |
| 7,173,182 B2 | 2/2007 | Katsuyama | 174/36 |
| 7,177,925 B2 | 2/2007 | Carcido et al. | 709/223 |
| 7,182,147 B2 | 2/2007 | Cutler et al. | 173/1 |
| 7,184,866 B2 | 2/2007 | Squires | 340/426.15 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,202,636 B2 | 4/2007 | Reynolds et al. | 320/166 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al. | 700/276 |
| 7,212,911 B2 | 5/2007 | Raichle et al. | 701/114 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,251,551 B2 | 7/2007 | Mitsueda | 700/2 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,301,303 B1 | 11/2007 | Hulden | 320/103 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,376,497 B2 | 5/2008 | Chen | 701/31.6 |
| 7,398,176 B2 | 7/2008 | Bertness | |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,504,830 B2 | 3/2009 | Keuss | |
| 7,505,856 B2 | 3/2009 | Restaino et al. | 702/63 |
| 7,538,771 B2 | 5/2009 | Raichle et al. | 324/772 |
| 7,545,146 B2 | 6/2009 | Klang et al. | 324/426 |
| 7,557,586 B1 | 7/2009 | Vonderhaar et al. | 324/437 |
| 7,571,035 B2 | 8/2009 | Raichle | |
| 7,590,476 B2 | 9/2009 | Shumate | 701/31.6 |
| 7,592,776 B2 | 9/2009 | Tsukamoto et al. | 320/136 |
| 7,595,643 B2 | 9/2009 | Klang | 324/426 |
| 7,596,437 B1 | 9/2009 | Hunt et al. | |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,667,437 B2 | 2/2010 | Johnson et al. | 320/150 |
| 7,679,325 B2 | 3/2010 | Seo | 20/116 |
| 7,684,908 B1 | 3/2010 | Ogilvie et al. | 701/29.6 |
| 7,688,074 B2 | 3/2010 | Cox et al. | 324/426 |
| 7,690,573 B2 | 4/2010 | Raichle et al. | 235/462 |
| 7,696,759 B2 | 4/2010 | Raichle et al. | 324/538 |
| 7,698,179 B2 | 4/2010 | Leung et al. | 705/28 |
| 7,705,602 B2 | 4/2010 | Bertness | 324/426 |
| 7,706,991 B2 | 4/2010 | Bertness et al. | 702/63 |
| 7,706,992 B2 | 4/2010 | Ricci et al. | |
| 7,710,119 B2 | 5/2010 | Bertness | 324/426 |
| 7,723,993 B2 | 5/2010 | Klang | 324/431 |
| 7,728,556 B2 | 6/2010 | Yano et al. | 320/134 |
| 7,728,597 B2 | 6/2010 | Bertness | 324/426 |
| 7,729,880 B1 | 6/2010 | Mashburn | 702/151 |
| 7,743,788 B2 | 6/2010 | Schmitt | 137/554 |
| 7,751,953 B2 | 7/2010 | Namaky | 701/33.2 |
| 7,772,850 B2 | 8/2010 | Bertness | 324/426 |
| 7,774,130 B2 | 8/2010 | Pepper | 340/439 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,848,857 B2 | 12/2010 | Nasr et al. | 701/22 |
| 7,883,002 B2 | 2/2011 | Jin et al. | 235/376 |
| 7,902,990 B2 | 3/2011 | Delmonico et al. | 340/636.1 |
| 7,914,350 B1 | 3/2011 | Bozich | 439/506 |
| 7,924,015 B2 | 4/2011 | Bertness | 324/427 |
| 7,940,052 B2 | 5/2011 | Vonderhaar | |
| 7,940,053 B2 | 5/2011 | Brown et al. | 324/426 |
| 7,959,476 B2 | 6/2011 | Smith et al. | |
| 7,977,914 B2 | 7/2011 | Bertness | |
| D643,759 S | 8/2011 | Bertness | |
| 7,990,155 B2 | 8/2011 | Henningson | 324/429 |
| 7,999,505 B2 | 8/2011 | Bertness | 320/104 |
| 8,024,083 B2 | 9/2011 | Chenn | 701/2 |
| 8,047,868 B1 | 11/2011 | Korcynski | 439/522 |
| 8,164,343 B2 | 4/2012 | Bertness | 324/503 |
| 8,198,900 B2 | 6/2012 | Bertness et al. | |
| 8,203,345 B2 | 6/2012 | Bertness | |
| 8,222,868 B2 | 7/2012 | Buckner | 320/136 |
| 8,226,008 B2 | 7/2012 | Raichle et al. | 235/462.13 |
| 8,237,448 B2 | 8/2012 | Bertness | |
| 8,306,690 B2 | 11/2012 | Bertness | 701/34.4 |
| 8,310,271 B2 | 11/2012 | Raichle et al. | 324/765.01 |
| 8,344,685 B2 | 1/2013 | Bertness et al. | |
| 8,436,619 B2 | 5/2013 | Bertness et al. | |
| 8,442,877 B2 | 5/2013 | Bertness et al. | |
| 8,449,560 B2 | 5/2013 | Roth | 227/175.1 |
| 8,493,022 B2 | 7/2013 | Bertness | |
| D687,727 S | 8/2013 | Kehoe et al. | |
| 8,509,212 B2 | 8/2013 | Sanjeev | |
| 8,513,949 B2 | 8/2013 | Bertness | |
| 8,594,957 B2 | 11/2013 | Gauthier | 324/548 |
| 8,674,654 B2 | 3/2014 | Bertness | |
| 8,674,711 B2 | 3/2014 | Bertness | |
| 8,704,483 B2 | 4/2014 | Bertness et al. | |
| 8,738,309 B2 | 5/2014 | Bertness | |
| 8,754,653 B2 | 6/2014 | Volderhaar et al. | |
| 8,810,200 B2 | 8/2014 | Kondo | |
| 8,825,272 B1 | 9/2014 | Chinnadurai | |
| 8,827,729 B2 | 9/2014 | Gunreben | 439/188 |
| 8,872,516 B2 | 10/2014 | Bertness | |
| 8,872,517 B2 | 10/2014 | Philbrook et al. | |
| 8,958,998 B2 | 2/2015 | Bertness | |
| 8,963,550 B2 | 2/2015 | Bertness et al. | |
| 9,018,958 B2 | 4/2015 | Bertness | |
| 9,037,394 B2 | 5/2015 | Fernandes | 701/400 |
| 9,052,366 B2 | 6/2015 | Bertness | |
| 9,056,556 B1 * | 6/2015 | Hyde | B60L 58/19 |
| 9,166,261 B2 | 10/2015 | Ibi | |
| 9,201,120 B2 | 12/2015 | Stukenburg | |
| 9,229,062 B2 | 1/2016 | Stukenberg | |
| 9,244,100 B2 | 1/2016 | Coleman et al. | |
| 9,255,955 B2 | 2/2016 | Bertness | 324/503 |
| 9,274,157 B2 | 3/2016 | Bertness | |
| 9,312,575 B2 | 4/2016 | Stukenberg | |
| 9,335,362 B2 | 5/2016 | Bertness | |
| 9,419,311 B2 | 8/2016 | Bertness | |
| 9,425,487 B2 | 8/2016 | Bertness | |

(56) References Cited

U.S. PATENT DOCUMENTS

| | | | |
|---|---|---|---|
| 9,496,720 B2 | 11/2016 | McShane | |
| 9,588,185 B2 | 3/2017 | Champlin | |
| 9,639,899 B1 | 5/2017 | Gersitz | |
| 9,923,289 B2 | 3/2018 | Bertness | |
| 9,966,676 B2 | 5/2018 | Salo, III et al. | |
| 10,046,649 B2 | 8/2018 | Bertness | |
| 10,222,397 B2 | 3/2019 | Salo et al. | |
| 10,317,468 B2 | 6/2019 | Bertness | |
| 10,429,449 B2 | 10/2019 | Arnoldus | |
| 10,473,555 B2 | 11/2019 | Bertness | |
| 10,525,841 B2 | 1/2020 | Zhou et al. | |
| 10,608,353 B2 | 3/2020 | Lipkin et al. | |
| 10,843,574 B2 | 11/2020 | Palmisano et al. | |
| 11,325,479 B2 | 5/2022 | Bertness | |
| 2001/0012738 A1 | 8/2001 | Duperret | 439/835 |
| 2001/0033169 A1 | 10/2001 | Singh | 324/426 |
| 2001/0035737 A1 | 11/2001 | Nakanishi et al. | 320/122 |
| 2001/0048215 A1 | 12/2001 | Breed et al. | 280/728.1 |
| 2001/0048226 A1 | 12/2001 | Nada | 290/40 |
| 2002/0003423 A1 | 1/2002 | Bertness et al. | 324/426 |
| 2002/0004694 A1 | 1/2002 | McLeod | 701/29 |
| 2002/0007237 A1 | 1/2002 | Phung et al. | 701/33 |
| 2002/0010558 A1 | 1/2002 | Bertness et al. | 702/63 |
| 2002/0021135 A1 | 2/2002 | Li et al. | 324/677 |
| 2002/0027346 A1 | 3/2002 | Breed et al. | 280/735 |
| 2002/0030495 A1 | 3/2002 | Kechmire | 324/427 |
| 2002/0036504 A1 | 3/2002 | Troy et al. | 324/430 |
| 2002/0041175 A1 | 4/2002 | Lauper et al. | 320/106 |
| 2002/0044050 A1 | 4/2002 | Derbyshire et al. | 340/442 |
| 2002/0047711 A1 | 4/2002 | Bertness et al. | 324/426 |
| 2002/0050163 A1 | 5/2002 | Makhija et al. | 73/116 |
| 2002/0065619 A1 | 5/2002 | Bertness | 702/63 |
| 2002/0074398 A1 | 6/2002 | Lancos et al. | 235/382 |
| 2002/0116140 A1 | 8/2002 | Rider | 702/63 |
| 2002/0118111 A1 | 8/2002 | Brown et al. | 340/573.1 |
| 2002/0121877 A1 | 9/2002 | Smith et al. | |
| 2002/0121901 A1 | 9/2002 | Hoffman | 324/426 |
| 2002/0128985 A1 | 9/2002 | Greenwald | 705/400 |
| 2002/0152791 A1 | 10/2002 | Cardinale | |
| 2002/0153864 A1 | 10/2002 | Bertness | 320/132 |
| 2002/0171428 A1 | 11/2002 | Bertness | 702/63 |
| 2002/0176010 A1 | 11/2002 | Wallach et al. | 348/362 |
| 2002/0193955 A1 | 12/2002 | Bertness | 702/63 |
| 2003/0006779 A1 | 1/2003 | Youval | 324/503 |
| 2003/0009270 A1 | 1/2003 | Breed | 701/29 |
| 2003/0017753 A1 | 1/2003 | Palmisano et al. | 439/762 |
| 2003/0025481 A1 | 2/2003 | Bertness | 324/427 |
| 2003/0030442 A1 | 2/2003 | Sugimoto | 324/429 |
| 2003/0036909 A1 | 2/2003 | Kato | 704/275 |
| 2003/0040873 A1 | 2/2003 | Lesesky et al. | 702/57 |
| 2003/0060953 A1 | 3/2003 | Chen | 701/33 |
| 2003/0078743 A1 | 4/2003 | Bertness et al. | 702/63 |
| 2003/0088375 A1 | 5/2003 | Bertness et al. | 702/63 |
| 2003/0090272 A1 | 5/2003 | Bertness | 324/426 |
| 2003/0114206 A1 | 6/2003 | Timothy | 455/575.7 |
| 2003/0124417 A1 | 7/2003 | Bertness et al. | 429/90 |
| 2003/0128011 A1 | 7/2003 | Bertness et al. | |
| 2003/0128036 A1 | 7/2003 | Henningson et al. | 324/426 |
| 2003/0137277 A1 | 7/2003 | Mori et al. | 320/132 |
| 2003/0155930 A1 | 8/2003 | Thomsen | |
| 2003/0164073 A1 | 9/2003 | Chen | |
| 2003/0169018 A1 | 9/2003 | Berels et al. | 320/132 |
| 2003/0169019 A1 | 9/2003 | Oosaki | 320/132 |
| 2003/0171111 A1 | 9/2003 | Clark | 455/414.1 |
| 2003/0173971 A1 | 9/2003 | Bertness | 324/441 |
| 2003/0177417 A1 | 9/2003 | Malhotra et al. | 714/42 |
| 2003/0184262 A1 | 10/2003 | Makhija | 320/156 |
| 2003/0184264 A1 | 10/2003 | Bertness | |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2003/0224241 A1 | 12/2003 | Takada et al. | 429/52 |
| 2003/0236656 A1 | 12/2003 | Dougherty | 703/14 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0036443 A1 | 2/2004 | Bertness | 320/109 |
| 2004/0044452 A1 | 3/2004 | Bauer et al. | 703/33 |
| 2004/0044454 A1 | 3/2004 | Ross et al. | 701/33 |
| 2004/0046564 A1 | 3/2004 | Klang | 324/426 |
| 2004/0049361 A1 | 3/2004 | Hamdan et al. | 702/115 |
| 2004/0051532 A1 | 3/2004 | Smith et al. | 324/426 |
| 2004/0051533 A1 | 3/2004 | Namaky | 324/426 |
| 2004/0051534 A1 | 3/2004 | Kobayashi et al. | 324/429 |
| 2004/0054503 A1 | 3/2004 | Namaky | 702/182 |
| 2004/0064225 A1 | 4/2004 | Jammu et al. | 701/29 |
| 2004/0065489 A1 | 4/2004 | Aberle | 180/65.1 |
| 2004/0088087 A1 | 5/2004 | Fukushima et al. | 701/32 |
| 2004/0104728 A1 | 6/2004 | Bertness et al. | 324/429 |
| 2004/0108855 A1 | 6/2004 | Raichle | 324/378 |
| 2004/0108856 A1 | 6/2004 | Johnson | 324/426 |
| 2004/0113494 A1 | 6/2004 | Karuppana et al. | |
| 2004/0113588 A1 | 6/2004 | Mikuriya et al. | 320/128 |
| 2004/0145342 A1 | 7/2004 | Lyon | 320/108 |
| 2004/0145371 A1 | 7/2004 | Bertness | 324/426 |
| 2004/0150494 A1 | 8/2004 | Yoshida | 333/243 |
| 2004/0157113 A1 | 8/2004 | Klang | 429/50 |
| 2004/0164706 A1 | 8/2004 | Osborne | 320/116 |
| 2004/0172177 A1 | 9/2004 | Nagai et al. | 701/29 |
| 2004/0178185 A1 | 9/2004 | Yoshikawa et al. | 219/270 |
| 2004/0189309 A1 | 9/2004 | Bertness et al. | 324/426 |
| 2004/0199343 A1 | 10/2004 | Cardinal et al. | 702/63 |
| 2004/0207367 A1 | 10/2004 | Taniguchi et al. | 320/149 |
| 2004/0221641 A1 | 11/2004 | Moritsugu | 73/23.31 |
| 2004/0227523 A1 | 11/2004 | Namaky | 324/537 |
| 2004/0239332 A1 | 12/2004 | MacKel et al. | 324/426 |
| 2004/0251876 A1 | 12/2004 | Bertness et al. | 320/136 |
| 2004/0251907 A1* | 12/2004 | Kalley | G01R 31/36 324/426 |
| 2004/0257084 A1 | 12/2004 | Restaino | 324/400 |
| 2005/0007068 A1 | 1/2005 | Johnson et al. | 320/110 |
| 2005/0009122 A1 | 1/2005 | Whelan et al. | 435/7.32 |
| 2005/0017726 A1 | 1/2005 | Koran et al. | 324/433 |
| 2005/0017952 A1 | 1/2005 | His | 345/169 |
| 2005/0021197 A1 | 1/2005 | Zimmerman | 701/31.4 |
| 2005/0021294 A1 | 1/2005 | Trsar et al. | 702/183 |
| 2005/0021475 A1 | 1/2005 | Bertness | 705/63 |
| 2005/0025299 A1 | 2/2005 | Tischer et al. | 379/199 |
| 2005/0035752 A1 | 2/2005 | Bertness | |
| 2005/0043868 A1 | 2/2005 | Mitcham | 701/29 |
| 2005/0057256 A1 | 3/2005 | Bertness | 324/426 |
| 2005/0060070 A1 | 3/2005 | Kapolka et al. | 701/29 |
| 2005/0073314 A1 | 4/2005 | Bertness et al. | 324/433 |
| 2005/0076381 A1 | 4/2005 | Gross | 725/107 |
| 2005/0077904 A1 | 4/2005 | Bertness | 324/426 |
| 2005/0096809 A1 | 5/2005 | Skeen et al. | 701/29 |
| 2005/0102073 A1 | 5/2005 | Ingram | 701/29 |
| 2005/0119809 A1 | 6/2005 | Chen | 701/33.5 |
| 2005/0128083 A1 | 6/2005 | Puzio et al. | 340/572.1 |
| 2005/0128902 A1 | 6/2005 | Tsai | 369/44.32 |
| 2005/0133245 A1 | 6/2005 | Katsuyama | 174/74 R |
| 2005/0134282 A1 | 6/2005 | Averbuch | 324/426 |
| 2005/0143882 A1 | 6/2005 | Umezawa | 701/29 |
| 2005/0159847 A1 | 7/2005 | Shah et al. | 700/276 |
| 2005/0162172 A1 | 7/2005 | Bertness | 324/426 |
| 2005/0168226 A1 | 8/2005 | Quint et al. | 324/426 |
| 2005/0173142 A1 | 8/2005 | Cutler et al. | 173/181 |
| 2005/0182536 A1 | 8/2005 | Doyle et al. | 701/29 |
| 2005/0184732 A1 | 8/2005 | Restaino | 324/426 |
| 2005/0192045 A1 | 9/2005 | Lowles | |
| 2005/0206346 A1 | 9/2005 | Smith et al. | |
| 2005/0212521 A1 | 9/2005 | Bertness et al. | 324/426 |
| 2005/0213874 A1 | 9/2005 | Kline | 385/15 |
| 2005/0218902 A1 | 10/2005 | Restaino et al. | 324/433 |
| 2005/0231205 A1 | 10/2005 | Bertness et al. | 324/426 |

(56) References Cited

U.S. PATENT DOCUMENTS

| | | | |
|---|---|---|---|
| 2005/0254106 A9 | 11/2005 | Silverbrook et al. | 358/539 |
| 2005/0256617 A1 | 11/2005 | Cawthorne et al. | 701/22 |
| 2005/0258241 A1 | 11/2005 | McNutt et al. | 235/385 |
| 2005/0264296 A1 | 12/2005 | Philbrook | 324/433 |
| 2005/0269880 A1 | 12/2005 | Konishi | 307/10.7 |
| 2005/0273218 A1 | 12/2005 | Breed | 701/2 |
| 2006/0012330 A1 | 1/2006 | Okumura et al. | 320/103 |
| 2006/0017447 A1 | 1/2006 | Bertness | 324/538 |
| 2006/0026017 A1 | 2/2006 | Walkder | 701/31.4 |
| 2006/0030980 A1 | 2/2006 | St. Denis | 701/29 |
| 2006/0038572 A1 | 2/2006 | Philbrook | |
| 2006/0043976 A1 | 3/2006 | Gervais | 324/508 |
| 2006/0061469 A1 | 3/2006 | Jaeger | 340/539.13 |
| 2006/0076923 A1 | 4/2006 | Eaves | 320/112 |
| 2006/0079203 A1 | 4/2006 | Nicolini | 455/411 |
| 2006/0089767 A1 | 4/2006 | Sowa | 701/29 |
| 2006/0090554 A1 | 5/2006 | Krampitz | |
| 2006/0090555 A1 | 5/2006 | Krampitz | |
| 2006/0091597 A1 | 5/2006 | Opsahl | |
| 2006/0092584 A1 | 5/2006 | Raichle | |
| 2006/0095230 A1 | 5/2006 | Grier et al. | 702/183 |
| 2006/0102397 A1 | 5/2006 | Buck | 429/432 |
| 2006/0125482 A1 | 6/2006 | Klang | |
| 2006/0136119 A1 | 6/2006 | Raichle | |
| 2006/0139167 A1 | 6/2006 | Davie | |
| 2006/0152224 A1 | 7/2006 | Kim et al. | 324/430 |
| 2006/0155439 A1 | 7/2006 | Slawinski | 701/33.4 |
| 2006/0161313 A1 | 7/2006 | Rogers et al. | 701/1 |
| 2006/0161390 A1 | 7/2006 | Namaky et al. | 702/183 |
| 2006/0217914 A1 | 9/2006 | Bertness | 702/113 |
| 2006/0244457 A1 | 11/2006 | Henningson et al. | 324/426 |
| 2006/0282227 A1 | 12/2006 | Bertness | |
| 2006/0282323 A1 | 12/2006 | Walker et al. | 705/14 |
| 2007/0005201 A1 | 1/2007 | Chenn | 701/31.5 |
| 2007/0024460 A1 | 2/2007 | Clark | 340/663 |
| 2007/0026916 A1 | 2/2007 | Juds et al. | 463/1 |
| 2007/0046261 A1 | 3/2007 | Porebski | 320/132 |
| 2007/0082652 A1 | 4/2007 | Hartigan | |
| 2007/0088472 A1 | 4/2007 | Ganzhorn et al. | 701/33 |
| 2007/0108942 A1 | 5/2007 | Johnson et al. | 320/112 |
| 2007/0159177 A1 | 7/2007 | Bertness et al. | 324/426 |
| 2007/0182576 A1 | 8/2007 | Proska et al. | 340/636.1 |
| 2007/0194791 A1 | 8/2007 | Huang | 324/430 |
| 2007/0194793 A1 | 8/2007 | Bertness | 324/503 |
| 2007/0205752 A1 | 9/2007 | Leigh | 324/500 |
| 2007/0205983 A1 | 9/2007 | Naimo | 345/160 |
| 2007/0210801 A1 | 9/2007 | Krampitz | 324/426 |
| 2007/0244660 A1 | 10/2007 | Bertness | |
| 2007/0259256 A1 | 11/2007 | Le Canut et al. | 429/90 |
| 2007/0279066 A1 | 12/2007 | Chism | 324/437 |
| 2008/0023547 A1 | 1/2008 | Raichle | 235/462.13 |
| 2008/0036421 A1 | 2/2008 | Seo et al. | 320/132 |
| 2008/0053716 A1 | 3/2008 | Scheucher | 180/2.1 |
| 2008/0059014 A1 | 3/2008 | Nasr et al. | 701/22 |
| 2008/0064559 A1 | 3/2008 | Cawthorne | 477/5 |
| 2008/0086246 A1 | 4/2008 | Bolt et al. | 701/29 |
| 2008/0087479 A1 | 4/2008 | Kang | |
| 2008/0094068 A1 | 4/2008 | Scott | 324/426 |
| 2008/0103656 A1 | 5/2008 | Lipscomb | 701/33.4 |
| 2008/0106267 A1 | 5/2008 | Bertness | 320/112 |
| 2008/0169818 A1 | 7/2008 | Lesesky et al. | 324/426 |
| 2008/0179122 A1 | 7/2008 | Sugawara | 180/65.245 |
| 2008/0194984 A1 | 8/2008 | Keefe | 600/559 |
| 2008/0303528 A1 | 12/2008 | Kim | 324/430 |
| 2008/0303529 A1 | 12/2008 | Nakamura et al. | 324/433 |
| 2008/0315830 A1 | 12/2008 | Bertness | 320/104 |
| 2009/0006476 A1 | 1/2009 | Andreasen et al. | 707/104.1 |
| 2009/0011327 A1 | 1/2009 | Okumura et al. | 429/99 |
| 2009/0013521 A1 | 1/2009 | Okumura et al. | 29/730 |
| 2009/0024266 A1 | 1/2009 | Bertness | 701/22 |
| 2009/0024419 A1 | 1/2009 | McClellan | 705/4 |
| 2009/0085571 A1 | 4/2009 | Bertness | 324/426 |
| 2009/0146610 A1 | 6/2009 | Trigiani | |
| 2009/0146800 A1 | 6/2009 | Grimlund et al. | 340/505 |
| 2009/0160395 A1 | 6/2009 | Chen | 320/101 |
| 2009/0184165 A1 | 7/2009 | Bertness et al. | |
| 2009/0198372 A1 | 8/2009 | Hammerslag | 700/226 |
| 2009/0203247 A1 | 8/2009 | Fifelski | 439/345 |
| 2009/0237029 A1 | 9/2009 | Andelfinger | 320/108 |
| 2009/0237086 A1 | 9/2009 | Andelfinger | 324/431 |
| 2009/0247020 A1 | 10/2009 | Gathman et al. | 439/759 |
| 2009/0251151 A1 | 10/2009 | Miyashita | |
| 2009/0259432 A1 | 10/2009 | Liberty | 702/150 |
| 2009/0265121 A1 | 10/2009 | Rocci | 702/57 |
| 2009/0273451 A1 | 11/2009 | Soppera et al. | |
| 2009/0276115 A1 | 11/2009 | Chen | 701/32 |
| 2009/0311919 A1 | 12/2009 | Smith | 439/759 |
| 2010/0023198 A1 | 1/2010 | Hamilton | 701/29 |
| 2010/0039065 A1 | 2/2010 | Kinkade | 320/104 |
| 2010/0052193 A1 | 3/2010 | Sylvester | 261/26 |
| 2010/0066283 A1 | 3/2010 | Kitanaka | 318/400.02 |
| 2010/0088050 A1 | 4/2010 | Keuss | 702/63 |
| 2010/0094496 A1 | 4/2010 | Hershkovitz et al. | |
| 2010/0117603 A1 | 5/2010 | Makhija | 320/162 |
| 2010/0145780 A1 | 6/2010 | Nishikawa et al. | 705/14.11 |
| 2010/0214055 A1 | 8/2010 | Fuji | 340/3.1 |
| 2010/0265131 A1 | 10/2010 | Fabius | |
| 2010/0314950 A1 | 12/2010 | Rutkowski et al. | 307/125 |
| 2011/0004427 A1 | 1/2011 | Gorbold et al. | 702/63 |
| 2011/0015815 A1 | 1/2011 | Bertness | 701/22 |
| 2011/0106280 A1 | 5/2011 | Zeier | 700/90 |
| 2011/0161025 A1 | 6/2011 | Tomura | 702/63 |
| 2011/0215767 A1 | 9/2011 | Johnson et al. | 320/136 |
| 2011/0218747 A1 | 9/2011 | Bertness | 702/63 |
| 2011/0258112 A1 | 10/2011 | Eder et al. | |
| 2011/0265025 A1 | 10/2011 | Bertness | |
| 2011/0267067 A1 | 11/2011 | Bertness et al. | |
| 2011/0273181 A1 | 11/2011 | Park et al. | 324/429 |
| 2011/0294367 A1 | 12/2011 | Moon | 439/878 |
| 2011/0300416 A1 | 12/2011 | Bertness | |
| 2012/0041697 A1 | 2/2012 | Stukenberg | 702/63 |
| 2012/0046807 A1 | 2/2012 | Ruther | 701/2 |
| 2012/0046824 A1 | 2/2012 | Ruther et al. | 701/31.5 |
| 2012/0062237 A1 | 3/2012 | Robinson | 324/433 |
| 2012/0074904 A1 | 3/2012 | Rutkowski et al. | 320/112 |
| 2012/0086399 A1 | 4/2012 | Choi | |
| 2012/0116391 A1 | 5/2012 | Houser | 606/41 |
| 2012/0182132 A1 | 7/2012 | McShane | |
| 2012/0249069 A1 | 10/2012 | Ohtomo | 320/109 |
| 2012/0256494 A1 | 10/2012 | Kesler | 307/104 |
| 2012/0256568 A1 | 10/2012 | Lee | 318/139 |
| 2012/0274331 A1 | 11/2012 | Liu | 324/426 |
| 2012/0293372 A1 | 11/2012 | Amendolare | 342/451 |
| 2013/0099747 A1 | 4/2013 | Baba | 310/118 |
| 2013/0106362 A1 | 5/2013 | Mackintosh et al. | |
| 2013/0106596 A1 | 5/2013 | Mouchet | |
| 2013/0115821 A1 | 5/2013 | Golko | 439/638 |
| 2013/0134926 A1 | 5/2013 | Yoshida | |
| 2013/0158782 A1 | 6/2013 | Bertness et al. | 701/34.4 |
| 2013/0172019 A1 | 7/2013 | Youssef | 455/456.6 |
| 2013/0200855 A1 | 8/2013 | Christensen et al. | |
| 2013/0218781 A1 | 8/2013 | Simon | |
| 2013/0288706 A1 | 10/2013 | Yu | 455/456.1 |
| 2013/0297247 A1 | 11/2013 | Jardine | |
| 2013/0311124 A1 | 11/2013 | Van Bremen | 702/104 |
| 2013/0314041 A1 | 11/2013 | Proebstle | 320/109 |
| 2013/0325405 A1 | 12/2013 | Miller | |
| 2014/0002021 A1 | 1/2014 | Bertness | |
| 2014/0002094 A1 | 1/2014 | Champlin | 324/426 |
| 2014/0029308 A1 | 1/2014 | Cojocaru | 363/13 |
| 2014/0081527 A1 | 3/2014 | Miller | |
| 2014/0099830 A1 | 4/2014 | Byrne | 439/638 |
| 2014/0117997 A1 | 5/2014 | Bertness | 324/426 |
| 2014/0145670 A1 | 5/2014 | van Zwan et al. | |
| 2014/0194084 A1 | 7/2014 | Noonan | 455/404.1 |
| 2014/0225622 A1 | 8/2014 | Kudo | 324/433 |
| 2014/0239964 A1 | 8/2014 | Gach | 324/433 |
| 2014/0260577 A1 | 9/2014 | Chinnadurai | |
| 2014/0266061 A1 | 9/2014 | Wachal | |
| 2014/0278159 A1 | 9/2014 | Chinnadurai | |
| 2014/0354237 A1 | 12/2014 | Cotton | |
| 2014/0368156 A1 | 12/2014 | Aloe | |
| 2014/0374475 A1* | 12/2014 | Kallfelz | H01M 10/4285 235/375 |

(56) References Cited

U.S. PATENT DOCUMENTS

| | | | |
|---|---|---|---|
| 2015/0093922 A1 | 4/2015 | Bosscher | 439/39 |
| 2015/0115720 A1 | 4/2015 | Hysell | 307/65 |
| 2015/0166518 A1 | 6/2015 | Boral et al. | |
| 2015/0168499 A1 | 6/2015 | Palmisano | |
| 2015/0221135 A1 | 8/2015 | Hill | 345/633 |
| 2015/0239365 A1* | 8/2015 | Hyde | B60L 58/26 |
| | | | 701/2 |
| 2016/0011271 A1 | 1/2016 | Bertness | |
| 2016/0091571 A1 | 3/2016 | Salo, III | |
| 2016/0154044 A1 | 6/2016 | Bertness | |
| 2016/0171799 A1 | 6/2016 | Bertness | |
| 2016/0216335 A1 | 7/2016 | Bertness | |
| 2016/0232736 A1 | 8/2016 | Holtappels | |
| 2016/0238667 A1 | 8/2016 | Palmisano et al. | |
| 2016/0253852 A1 | 9/2016 | Bertness et al. | |
| 2016/0266212 A1* | 9/2016 | Carlo | G06K 9/6215 |
| 2016/0285284 A1 | 9/2016 | Matlapudi et al. | |
| 2016/0321897 A1 | 11/2016 | Lee | |
| 2016/0336623 A1 | 11/2016 | Nayar | |
| 2017/0093056 A1 | 3/2017 | Salo, III et al. | |
| 2017/0146602 A1 | 5/2017 | Samp | |
| 2017/0158058 A1 | 6/2017 | Lee et al. | |
| 2017/0373410 A1 | 12/2017 | Lipkin et al. | |
| 2018/0009328 A1 | 1/2018 | Hinterberger et al. | |
| 2018/0113171 A1 | 4/2018 | Bertness | |
| 2018/0306867 A1 | 10/2018 | Bertness | |
| 2019/0105998 A1 | 4/2019 | Bertness | |
| 2019/0152332 A1 | 5/2019 | Bertness | |
| 2019/0154763 A1 | 5/2019 | Bertness | |
| 2019/0204392 A1 | 7/2019 | Bertness | |
| 2020/0086757 A1 | 3/2020 | Vain et al. | |
| 2020/0174078 A1 | 6/2020 | Salo, III et al. | |
| 2021/0048374 A1 | 2/2021 | Sampson et al. | |
| 2021/0049480 A1 | 2/2021 | Kale et al. | |
| 2021/0135462 A1 | 5/2021 | Sampson et al. | |
| 2021/0141021 A1 | 5/2021 | Salo, III et al. | |
| 2021/0141043 A1 | 5/2021 | Bertness | |
| 2021/0203016 A1 | 7/2021 | Bertness | |
| 2021/0231737 A1 | 7/2021 | Salo, III et al. | |
| 2021/0325471 A1 | 10/2021 | Bertness | |

FOREIGN PATENT DOCUMENTS

| | | |
|---|---|---|
| CN | 103091633 | 5/2013 |
| CN | 206658084 | 11/2017 |
| DE | 29 26 716 B1 | 1/1981 |
| DE | 40 07 883 | 9/1991 |
| DE | 196 38 324 | 9/1996 |
| DE | 601 12 502 T2 | 6/2006 |
| DE | 10 2009 013 857 | 10/2009 |
| DE | 10 2008 036 595 A1 | 2/2010 |
| EP | 0 022 450 A1 | 1/1981 |
| EP | 0 391 694 A2 | 4/1990 |
| EP | 0 476 405 A1 | 9/1991 |
| EP | 0 637 754 A1 | 2/1995 |
| EP | 0 772 056 A1 | 5/1997 |
| EP | 0 982 159 A2 | 3/2000 |
| EP | 1 810 869 A1 | 11/2004 |
| EP | 1 786 057 | 5/2007 |
| EP | 1 807 710 B1 | 7/2007 |
| EP | 1 807 710 | 1/2010 |
| EP | 2 302 724 | 3/2011 |
| FR | 2 749 397 | 12/1997 |
| GB | 154 016 | 11/1920 |
| GB | 2 029 586 | 3/1980 |
| GB | 2 088 159 A | 6/1982 |
| GB | 2 246 916 A | 10/1990 |
| GB | 2 266 150 | 10/1993 |
| GB | 2 275 783 A | 7/1994 |
| GB | 2 353 367 | 2/2001 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| JP | 11-271409 | 10/1999 |
| JP | 2001-023037 | 1/2001 |
| JP | 2001057711 A | 2/2001 |
| JP | 2003-346909 | 12/2003 |
| JP | 2005-238969 | 9/2005 |
| JP | 2006/242674 | 9/2006 |
| JP | 2006331976 A | 12/2006 |
| JP | 2009-244166 | 10/2009 |
| JP | 2009-261174 | 11/2009 |
| JP | 2010-172122 | 5/2010 |
| JP | 2010-172142 | 8/2010 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/21132 | 5/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |
| WO | WO 2007/075403 | 7/2007 |
| WO | WO 2009/004001 | 1/2009 |
| WO | WO 2010/007681 | 1/2010 |
| WO | WO 2010/035605 | 4/2010 |
| WO | WO 2010/042517 | 4/2010 |
| WO | WO 2011/153419 | 12/2011 |
| WO | WO 2012/078921 | 6/2012 |
| WO | WO 2013/070850 | 5/2013 |

OTHER PUBLICATIONS

"Battery Impedance", by E. Willihnganz et al., *Electrical Engineering*, Sep. 1959, pp. 922-925.
"Determining the End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.

(56) References Cited

OTHER PUBLICATIONS

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113. 006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Wilihncanz, *The Electrochemical Society*, preprint 79-20, Apr. 1941, pp. 253-258.
National Semiconductor Corporation, "High Q Notch Filter", Mar. 1969, Linear Brief 5, Mar. 1969.
Burr-Brown Corporation, "Design A 60 Hz Notch Filter with the UAF42", Jan. 1994, AB-071, 1994.
National Semiconductor Corporation, "LMF90-$4^{th}$-Order Elliptic Notch Filter", Dec. 1994, RRD-B30M115, Dec. 1994.
"Alligator Clips with Wire Penetrators" *J.S. Popper, Inc.* product information, downloaded from http://www.jspopper.com/, prior to Oct. 1, 2002.
"#12: LM78S40 Simple Switcher DC to DC Converter", *ITM e-Catalog*, downloaded from http://www.pcbcafe.com, prior to Oct. 1, 2002.
"Simple DC-DC Converts Allows Use of Single Battery", *Electronix Express*, downloaded from http://www.elexp.com/t_dc-dc.htm, prior to Oct. 1, 2002.
"DC-DC Converter Basics", *Power Designers*, downloaded from http://www.powerdesigners.com/InforWeb.design_center/articles/DC-DC/converter.shtm, prior to Oct. 1, 2002.
"Notification of Transmittal of the International Search Report or the Declaration", PCT/US02/29461, filed Sep. 17, 2002 and dated Jan. 3, 2003.
"Notification of Transmittal of the International Search Report or the Declaration", PCT/US03/07546, filed Mar. 13, 2003 and dated Jul. 4, 2001.
"Notification of Transmittal of the International Search Report or the Declaration", PCT/US03/06577, filed Mar. 5, 2003 and dated Jul. 24, 2003.
"Notification of Transmittal of the International Search Report or the Declaration", PCT/US03/07837, filed Mar. 14, 2003 and dated Jul. 4, 2003.
"Improved Impedance Spectroscopy Technique for Status Determination of Production Li/SO$_2$ Batteries" Terrill Atwater et al., pp. 10-113, (1992).
"Notification of Transmittal of the International Search Report or the Declaration", PCT/US03/41561; Search Report completed Apr. 13, 2004, dated May 6, 2004.
"Notification of Transmittal of the International Search Report or the Declaration", PCT/US03/27696, filed Sep. 4, 2003 and dated Apr. 15, 2004.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2; dated Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and dated Nov. 24, 2004.
"A review of impedance measurements for determination of the state-of-charge or state-of-health of secondary batteries", Journal of Power Sources, pp. 59-69, (1998).
"Search Report Under Section 17" for Great Britain Application No. GB0421447.4, date of search Jan. 27, 2005, dated Jan. 28, 2005.
"Results of Discrete Frequency Immittance Spectroscopy (DFIS) Measurements of Lead Acid Batteries", by K.S. Champlin et al., *Proceedings of $23^{rd}$ International Teleco Conference (INTELEC)*, published Oct. 2001, IEE, pp. 433-440.
"Examination Report" from the UK Patent Office for App. No. 0417678.0; dated Jan. 24, 2005.
Wikipedia Online Encyclopedia, Inductance, 2005, http://en.wikipedia.org/wiki/inductance, pp. 1-5, mutual Inductance, pp. 3, 4.
"Professional Bcs System Analyzer Battery-Charger-Starting", pgs. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, San Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
Notification of Transmittal of the International Search Report and the Written Opinion of the International Searching Authority, or the Declaration for PCT/US2011/038279 filed May 27, 2011, dated Sep. 16, 2011, 12 pages.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I—Conductance/ Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).

(56) References Cited

OTHER PUBLICATIONS

"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et al., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
Copy of Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
"Field Evaluation of Honda's EV PLUS Battery Packs", by A. Paryani, *IEEE AES Systems Magazine*, Nov. 2000, pp. 21-24.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs including English Translation.
Official Action dated Feb. 20, 2014 in Korean patent application No. 10-2013-7004814, 6 pgs including English Translation.
First Office Action for Chinese Patent Application No. 201180011597.4, dated May 6, 2014, 20 pages.
Office Action from Korean Application No. 10-2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 1120111020643 dated Aug. 28, 2014.
Office Action from Japanese Patent Application No. 2013-513370, dated Aug. 5, 2014.
Office Action from Japanese Patent Application No. 2013-531839, dated Jul. 8, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No 201180011597.4, dated Jan. 6, 2015.
Office Action for Chinese Patent Application No. 201180030045.8, dated Mar. 24, 2015.
Office Action for Japanese Patent Application No. 2013-531839, dated Mar. 31, 2015.
Notification of Transmittal of the International Search Report and Written Opinion from PCT/US2014/069661, dated Mar. 26, 2015.
Office Action for Chinese Patent Application No. 201180038844.X, dated Jun. 8, 2015.
Office Action from Chinese Patent Application No. 201180011597.4 dated Jun. 3, 2015.
European Search Report from European Application No. EP 15151426.2, dated Jun. 1, 2015.
Notification of Transmittal of the International Search Report and the Written Opinion from PCT/US2016/014867, dated Jun. 3, 2016.
Office Action from Japanese Patent Application No. 2015-014002, dated Jul. 19, 2016.
Notification of Transmittal of the International Search Report and the Written Opinion of the International Searching Authority from PCT/US2016/029696, dated Aug. 24, 2016.
Office Action from German Patent Application No. 10393251.8, dated Nov. 4, 2016, including English translation.
Office Action from European Patent Application No. 15 151 426.2-1801, dated Aug. 28, 2017, 2 pages.
Office Action from German Patent Application No. 112011101892.4, dated Sep. 7, 2017.
Office Action from Japanese Patent Application No. 2017-026740, dated Jan. 9, 2018.
Office Action from Chinese Patent Application No. 201480066251.8, dated May 29, 2018.
Brochure: "Sensors Intelligent Battery Sensors, Measuring Battery Capacity and Ageing", by Hella, 6 pgs.
Office Action from Japanese Patent Application No. 2017-026740, dated May 8, 2018.
U.S. Appl. No. 12/697,485, filed Feb. 1, 2010, 36 pgs.
Office Action from Chinese Patent Application No. 201480066251.8, dated Dec. 13, 2018.
Notification of Transmittal of the International Search Report and the Written Opinion of the International Searching Authority, or the Declaration for PCT/US2019/014487, dated Apr. 11, 2019.
Notification of Transmittal of the International Search Report and the Written Opinion of the International Searching Authority, or the Declaration for PCT/US2019/014494, dated Apr. 24, 2019.
Notification of Transmittal of the International Search Report and the Written Opinion of the International Searching Authority, or the Declaration for PCT/US2020/059015, dated Jan. 22, 2021.
U.S. Appl. No. 17/504,897, filed Oct. 19, 2021.
Notification of Transmittal of the International Search Report and the Written Opinion of the International Searching Authority, or the Declaration for PCT/US2021/040313 dated Oct. 25, 2021; 14 pages.
Office Action from German Patent Application No. 11 2011 101 892.4, dated Oct. 1, 2020, and translation using Google Translate.
Wikipedia Online Encyclopedia, https: // de.wikipedia.org/w/index.php?title=four-wire measurement &oldid=671433514-4 (Retrieved Sep. 15, 2020) along with Google Translation.

\* cited by examiner

VEHICLE BATTERY MAINTENANCE DEVICE

CROSS-REFERENCE TO RELATED APPLICATION

The present application is based on and claims the benefit of U.S. provisional patent application Ser. No. 62/772,882, filed Nov. 29, 2018, the content of which is hereby incorporated by reference in its entirety.

BACKGROUND

The present invention relates to battery maintenance devices of the type used to maintain or monitor a battery of an automotive vehicle. More specifically, the present invention relates to battery rating requirements associated with a particular vehicle.

Various types of battery testers and charging equipment are known in the art. Examples of various battery testers, chargers and monitors are forth in: U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. Nos. 6,456,045; 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,696,819, issued Feb. 24, 20144; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued march 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Pat. No. 8,164,343, issued Apr. 24, 2012; U.S. Pat. No. 8,198,900, issued Jun. 12, 2012; U.S. Pat. No. 8,203,345, issued Jun. 19, 2012; U.S. Pat. No. 8,237,448, issued Aug. 7, 2012; U.S. Pat. No. 8,306,690, issued Nov. 6, 2012; U.S. Pat. No. 8,344,685, issued Jan. 1, 2013; U.S. Pat. No. 8,436,619, issued May 7, 2013; U.S. Pat. No. 8,442,877, issued May 14, 2013; U.S. Pat. No. 8,493,022, issued Jul. 23, 2013; U.S. Pat. No. D687,727, issued Aug. 13, 2013; U.S. Pat. No. 8,513,949, issued Aug. 20, 2013; U.S. Pat. No. 8,674,654, issued Mar. 18, 2014; U.S. Pat. No. 8,674,711, issued Mar. 18, 2014; U.S. Pat. No. 8,704,483, issued Apr. 22, 2014; U.S. Pat. No. 8,738,309, issued May 27, 2014; U.S. Pat. No. 8,754,653, issued Jun. 17, 2014; U.S. Pat. No. 8,872,516, issued Oct. 28, 2014; U.S. Pat. No. 8,872,517, issued Oct. 28, 2014; U.S. Pat. No. 8,958,998, issued Feb. 17, 2015; U.S. Pat. No. 8,963,550, issued Feb. 24, 2015; U.S. Pat. No. 9,018,958, issued Apr. 28, 2015; U.S. Pat. No. 9,052,366, issued Jun. 9, 2015; U.S. Pat. No. 9,201,120, issued Dec. 1, 2015; U.S. Pat. No. 9,229,062, issued Jan. 5, 20126; U.S. Pat. No. 9,244,100, issued Jan. 26, 2016; U.S. Pat. No. 9,274,157, issued Mar. 1, 2016; U.S. Pat. No. 9,312,575, issued Apr. 12, 2016; U.S. Pat. No. 9,335,362, issued May 10, 2016; U.S. Pat. No. 9,425,487, issued Aug. 23, 2016; U.S. Pat. No. 9,419,311, issued Aug. 16, 2016; U.S. Pat. No. 9,496,720, issued Nov. 15, 2016; U.S. Pat. No. 9,588,185, issued Mar. 7, 2017; U.S. Pat. No. 9,923,289, issued Mar. 20, 2018; U.S. Pat. No. 9,966,676, issued May 8, 2018; U.S. Pat. No. 10,046,649, issued Aug. 14, 2018; U.S. Pat. No. 10,222,397, issued Mar. 5, 2019; U.S. Pat. No. 10,317,468, issued Jun. 11, 2019; U.S. Pat. No. 10,429,449, issued Oct. 1, 2019; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/263,473, filed Oct. 2, 2002, entitled ELECTRONIC BATTERY TESTER WITH RELATIVE TEST OUTPUT; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 11/356,443, filed Feb. 16, 2006, entitled ELECTRONIC BATTERY TESTER WITH NETWORK COMMUNICATION; U.S. Ser. No. 12/697,485, filed Feb. 1, 2010, entitled ELECTRONIC BATTERY TESTER; U.S. Ser. No. 12/769,911, filed Apr. 29, 2010, entitled STATIONARY BATTERY TESTER; U.S. Ser. No. 13/098,661, filed May 2, 2011, entitled METHOD AND APPARATUS FOR MEASURING A PARAMETER OF A VEHICLE ELECTRICAL SYSTEM; U.S. Ser. No. 13/152,711, filed Jun. 3, 2011, entitled BATTERY PACK MAINTENANCE FOR ELECTRIC VEHICLE; U.S. Ser. No. 14/039,746, filed Sep. 27, 2013, entitled BATTERY PACK MAINTENANCE FOR ELECTRIC VEHICLE; U.S. Ser. No. 14/565,689, filed Dec. 10, 2014, entitled BATTERY TESTER AND BATTERY REGISTRATION TOOL; U.S. Ser. No. 14/799,120, filed Jul. 14, 2015, entitled AUTOMOTIVE MAINTENANCE SYSTEM; U.S. Ser. No. 15/017,887, filed Feb. 8, 2016, entitled METHOD AND APPARATUS FOR MEASURING A PARAMETER OF A VEHICLE ELECTRICAL SYSTEM; U.S. Ser. No. 15/049,483, filed Feb. 22, 2016, entitled BATTERY TESTER FOR ELECTRIC VEHICLE; U.S. Ser. No. 15/077,975, filed Mar. 23, 2016, entitled BATTERY MAINTENANCE SYSTEM; U.S. Ser. No. 15/140,820, filed Apr. 28, 2016, entitled CALIBRATION AND PROGRAMMING OF IN-VEHICLE BATTERY SENSOR; U.S. Ser. No. 15/149,579, filed May 9, 2016, entitled BATTERY TESTER FOR ELECTRIC VEHICLE; U.S. Ser. No. 15/634,491, filed Jun. 27, 2017, entitled BATTERY CLAMP; U.S. Ser. No. 15/791,772, field Oct. 24, 2017, entitled ELECTRICAL LOAD FOR ELECTRONIC BATTERY TESTER AND ELECTRONIC BATTERY TESTER INCLUDING SUCH ELECTRICAL LOAD; U.S. Ser. No. 16/021,538, filed Jun. 28, 2018, entitled BATTERY PACK MAINTENANCE FOR ELECTRIC VEHICLE; U.S. Ser. No. 16/056,991, filed Aug. 7, 2018, entitled HYBRID AND ELECTRIC VEHICLE BATTERY PACK MAINTENANCE DEVICE, U.S. Ser. No. 16/253,526, filed Jan. 22, 2019, entitled HIGH CAPACITY BATTERY BALANCER; U.S. Ser. No. 16/253,549, filed Jan. 22, 2019, entitled HYBRID AND ELECTRIC VEHICLE BATTERY PACK MAINTENANCE DEVICE; U.S. Ser. No. 16/297,975, filed Mar. 11, 2019, entitled HIGH USE BATTERY PACK MAINTENANCE; all of which are incorporated herein by reference in their entireties.

SUMMARY

An electronic battery tester or battery charger for testing or charging a storage battery including electrical connectors configured to electrically couple to a terminals of the storage battery. Circuitry couples to the electrical connectors and is configured to test or charge the storage battery. An input signal is received related to a battery which is suitable for use with the vehicle.

DETAILED DESCRIPTION OF ILLUSTRATIVE EMBODIMENTS

Figure 1:
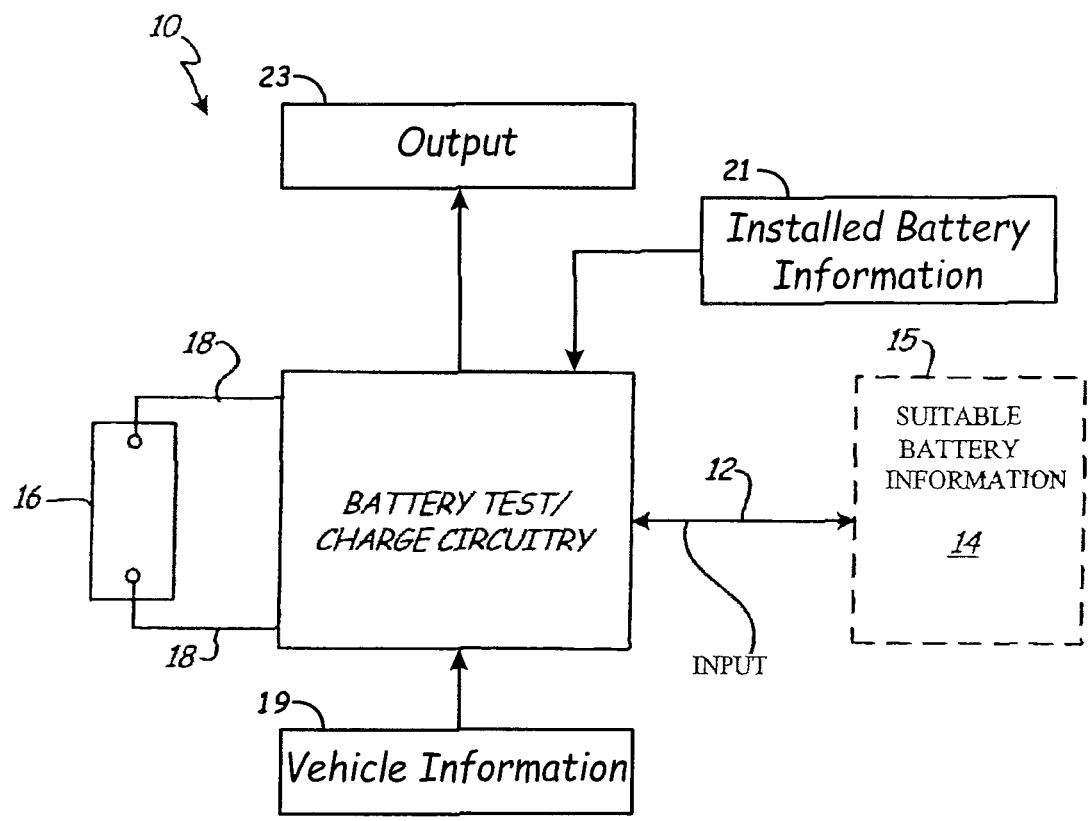
FIG. 1 is a simplified block diagram showing battery test or charge circuitry coupled to an on-board databus of the vehicle.

The present invention provides a battery tester or charger 10 (generally referred to herein as a battery maintenance device) such as that illustrated in FIG. 1 which includes an input 12 for coupling to suitable battery information 14. Element 10 can comprise a battery test circuitry, battery charge circuitry, or a combination of both. Element 14 can include a databus, user input, automatic input, databus, etc. In one configuration, element 14 is the internal circuitry of a vehicle 15 coupled to an OBD (On-Board Diagnostics) databus or the like. Circuitry 10 is configured to couple to storage battery 16 through electrical connectors 18 to perform a battery test on battery 16 or to charge battery 16. Connectors 18 can be, for example, Kelvin type connectors. When configured as a tester, circuitry 10 can obtain a dynamic parameter of the battery using an AC forcing function. Examples include dynamic conductance, resistance, admittance, impedance, their combinations, or others. However, any type of battery test can be performed including battery testing can be used including those which involve application of large or small loads, or application of large currents or voltages such as through a charger, simple voltage measurements, etc. In one embodiment, the battery tester 10 is permanently mounted in automotive vehicle 15. Vehicle 15 can include an internal combustion engine, electric motor, or a hybrid.

In another configuration, circuitry 10 comprises a battery charger and is configured to charge battery 16 through electrical connections 18. Further, in some configurations, circuitry 10 includes both testing and charging functionality. These functions can operate independently or, in some configurations, can be configured to operate together.

Databus 12 can be used to exchange information with information 14. Such information includes, for example, raw data measurements and conclusions of battery tester 10, and inputs, such as user inputs, or any information related to vehicle 15 or other information available on bus 12, along with other sensor inputs into battery tester 10. Further, 14 can control or communicate battery tester 10 through databus 12 and provide information such as a battery rating to 10 for use in performing a battery test or charging battery 16. Databus 12 can be a proprietary databus or can be in accordance with known standards such as RS232, CAN, ISA, PCI, PCMCIA, WiFi, Bluetooth, Ethernet, etc. In a specific embodiment, databus 12 is in accordance with an OBD communication protocol.

The circuitry 10 acquires information through databus 12 or monitors the flow of information on a databus of the vehicle. The circuit 10 can obtain information related to battery type, battery rating, charge history, etc. Additionally, if the vehicle contains an internal battery tester, information regarding battery tests or battery measurements can be obtained or monitored through bus 12. In such an embodiment, test circuit 10 does not need to perform a battery test itself, or couple to the battery.

FIG. 1 also shows vehicle information 19. Vehicle information 19 can comprise, for example, a bar code scanner used to scan the VIN code of a vehicle, a manual user input allowing an operator to input a VIN code or other information. Such other information may include, for example, vehicle year, make and model. This information can be used to retrieve suitable battery information 14 which can comprise, for example, battery specifications provided by the vehicle manufacturer or other battery recommendations for the particular identified vehicle. The suitable battery information 14 can be a database located internally to the battery tester, or can be information retrieved from an external location such as an external server, through cloud data services, etc.

The battery tester is also configured to receive and installed battery information 21. This can be, for example, through a bar code scanner 21 allowing an operator to scan a UPC bar code carried on the installed battery. Other scanable codes include a 2D or a QR code. Additionally, information 21 can comprise a manual battery rating input provided by an operator or other battery information such as battery make, size and rating.

Device 10 can also include an output 23 which provides information as discussed herein. The output can become for example, an on screen warning, on screening battery test results, printed battery test results, transmitted test results such as emailed test results or data otherwise sent to an external location including, for example, an external server/cloud data service. Elements 19 and 23 can comprise a single bar code scanner or manual input.

Figure 2A:
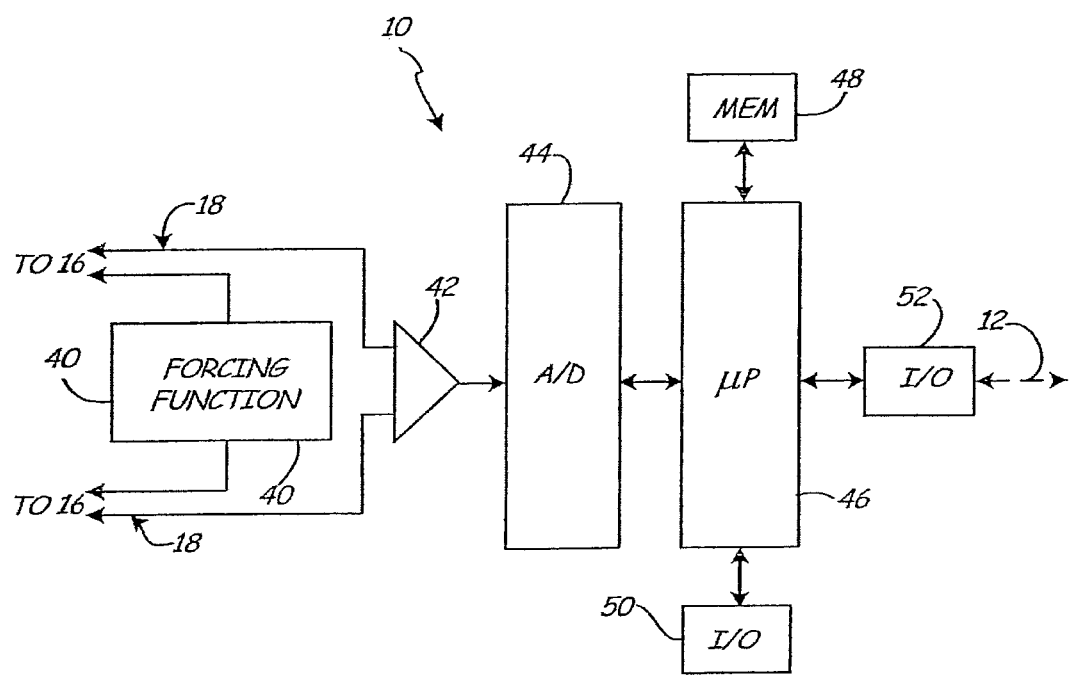
FIG. 2A is a simplified block diagram showing circuitry of FIG. 1 configured as a battery tester.
Figure 2B:
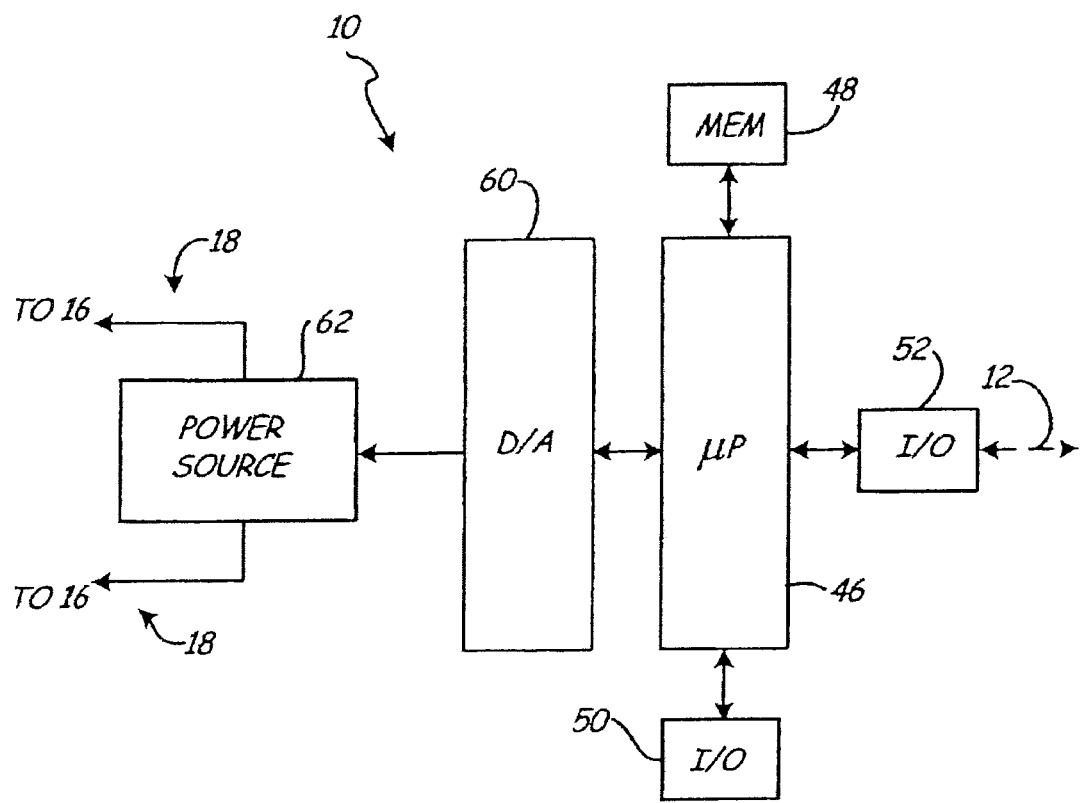
FIG. 2B is a simplified block diagram showing circuitry of FIG. 1 configured as a battery charger.

FIGS. 2A and 2B is a more detailed block diagram of device 10. In FIG. 2A, circuitry 10 is configured to operate as a battery tester and includes a forcing function 40 and an amplifier 42 coupled to connectors 18. Connectors 18 are shown as Kelvin connections. The forcing function 40 can be any type of signal which has a time varying component including a transient signal. The forcing function can be through application of a load or by applying an active signal to battery 16. A response signal is sensed by amplifier 42 and provided to analog to digital converter 44 which couples to microprocessor 46. Microprocessor 46 operates in accordance with instructions stored in memory 48. Input/output (I/O) 52 is provided for coupling to the databus 12. I/O 102 can be in accordance with the desired standard or protocol as described herein. Another input/output block 50 can be used, for example, for communicating with an operator and can comprise a display and an input such as a keypad or the like as well as an imaging device such as a camera or bar code scanner.

In the illustrated embodiment, microprocessor 46 is configured to measure a dynamic parameter based upon the forcing function 40. This dynamic parameter can be correlated with battery condition as set forth in the above-mentioned Champlin and Midtronics, Inc. patents. However, other types of battery tests circuitry can be used in the present invention and certain aspects of the invention should not be limited to the specific embodiment illustrated herein. Although a microprocessor 46 is shown, other types of computational or other circuitry can be used to collect and place data into memory 48.

FIG. 2B is another simplified block diagram showing circuitry 10 configured as a battery charger. In such a configuration, the microprocessor 46 couples to a digital to analog converter 60 which is used to control a power source 62. Power source 62 couples to battery 16 through connections 18. Although a digital to analog converter 60 is illustrated as controlling a power source 62, other types of control can be used, for example, a simple switch, or other control mechanisms. The power source 62 can operate in accordance with any charging technique and may include an internal power supply for charging the battery, or can be configured to couple to an external power source. One common external power source is simply the standard 120 volt, or 240 volt outlet power available in most settings. The power supply can also be used to power other aspects of circuitry 10. In one configuration the charger is separate from vehicle 15 and is not powered by an engine in the vehicle.

Figure 3:
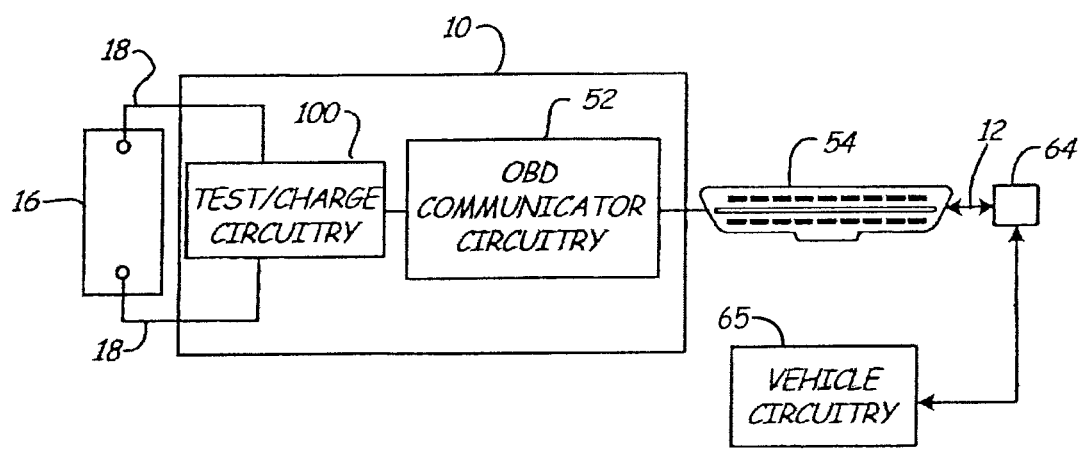
FIG. 3 is a block diagram showing a coupling between circuitry of FIG. 1 and the on-board databus of the vehicle.

FIG. 3 is a simplified block diagram showing an example configuration of battery tester/charger 10 in accordance with one embodiment of the invention. In the embodiment of FIG. 3, circuitry 10 is shown coupled to storage battery 16 through connections 18. As discussed above, this may comprise, for example, Kelvin connections. Circuitry 10 includes tester or charge circuitry 100. The circuitry 100 can be in accordance with any battery tester measurement or charging technique including those discussed above. The circuitry 100 may, in some configurations, include a microprocessor or other digital controller.

Circuitry 100 is configured to couple to battery 16 through electrical connectors 18. The circuitry 100 receives information from communication circuitry 52. Communication circuitry 52 communicates with vehicle circuitry 65 through a connector 54 and vehicle interface 64. The communication circuitry 52 is configured to operate in accordance with communication standards. Communication circuitry 52 communicates in accordance with a communication standard over databus 12 through connector 54. In various embodiments, circuitry within device 10 is powered by power received from battery 16, from an internal power source within device 10, and/or from power received from an external source.

During operation as a battery tester, circuitry 10 performs a battery test on the storage battery 16. In accordance with the present invention, the battery tester receives information from a databus or other input. The data can be used as part of the battery test such that the battery test output is a function of the data, or can be used in addition to the battery test itself. In one aspect, any type of data which is available over the on-board databus of a vehicle. Specific examples include obtaining information regarding the age of the vehicle, battery specifications, number of times that the engine of the vehicle has been started, number of times that the battery has been disconnected, the size of the alternator, and the electrical options on a vehicle. This information can also be used by the circuitry 10.

With the present invention, any information which is available from the onboard databus can be used in conjunction with testing and/or charging. For example, information regarding the vehicle such as a vehicle identification number (VIN), battery type, battery voltage during start, vehicle age, engine size, and other information. The connection to the OBD can be used to control idle speed of the engine, turn on loads of the vehicle and to further automate aspects of the testing. Engine speed can also be read from the OBD connection. In some configurations, the circuitry is configured to test other aspects of the vehicle such as the alternator. The onboard OBD connection to the vehicle can be used to control aspects of the vehicle for alternator testing. Trouble codes within the vehicle system can be set using the OBD connection. For example, if a high rate of charging is detected, a trouble code can be set accordingly. In some vehicles, the connection to the OBD of the vehicle can be used to reset trouble codes. For example, the occurrence of a successful charge of the battery can be used to reset a trouble code. In some vehicles, various temperatures can be obtained from the onboard databus. This temperature information can also be used in conjunction with testing or charging. Engine hours, key off statistics, alternator current output and other information can be made available.

In some types of hybrid vehicles that contain multiple batteries, the on-board databus can be used to access intermediary voltages within a string of batteries. This information can be used by the present invention to, for example, detect imbalances in the voltages which may occur during charging. Such an imbalance can be indicative of a failing battery within the string.

The present invention provides a battery test, electrical system test and/or battery charger for use with vehicles, including hybrid vehicles. The circuitry of the present invention couples to the on-board databus of a vehicle and uses information from the databus, or controls aspects of the vehicle through the databus, in conjunction with the testing or charging. In some aspects, the test or charge is a function of information retrieved from the on-board databus. In other aspects, the test or charge controls operation of components of the vehicle using the connection of the vehicle through the on-board databus.

Although the various connections between components shown here are illustrated as being wire connections, the invention is also applicable with wireless connections such as using radiofrequency (RF), infrared (IR), inductive coupling or through other wireless techniques. By providing the circuitry with access to the on board database of the vehicle, additional information can be garnered regarding operation of the vehicle and, in some configurations, operation of the vehicle can be controlled or otherwise configured.

With the present invention, a battery specification is obtained from the input. The battery specification can be, for example, in accordance with the original manufacturing specification for a particular vehicle. This information is then used to determine if the battery in the vehicle is properly sized for the vehicle. The information can be received through a manual input, or can be received through other techniques including automatic inputs for example by receiving information from the databus of the vehicle, by communicating with a remote database, by reading a VIN code of a vehicle, by reading a barcode or an RFID tag, etc.

Specific input examples include an automotive battery tester having an automotive vehicle OEM (Original Equipment Manufacturer) battery rating database; vehicle identification input methods, battery under test rating input methods, and calculations to determine whether the tested battery rating is within an appropriate range to be suitable for use in the vehicle. An automotive battery tester including an OEM battery rating database, whether locally on the tester, or through a cloud connection. An automotive battery tester including an OEM vehicle identification input through barcode scanning of the VIN, manual VIN entry, or using a lookup table of year, make, model, and options. An automotive battery tester including a UPC (Universal Product Code) based battery identification database. An automotive battery tester including battery under test identification, through manual entry of battery rating, or using a barcode scanner to identify the vehicle through the battery UPC database. An automotive battery tester performing calculations based on the installed battery under test versus the OEM battery rating for the vehicle. An automotive battery tester including methods to provide the tester user with a determination of suitability of the battery under test to be used with the vehicle it is installed in. An automotive battery tester which is able to provide messaging to the user to replace the battery based on being undersized for the vehicle per the vehicle OEM battery rating. An automotive battery tester including methods to communicate suitability through on-screen results, wireless or wired printing, email, and M2M (Machine to Machine) communication. An automotive battery tester including the ability to determine and correctly identify replacement battery for undersized battery being tested.

Figure 4:
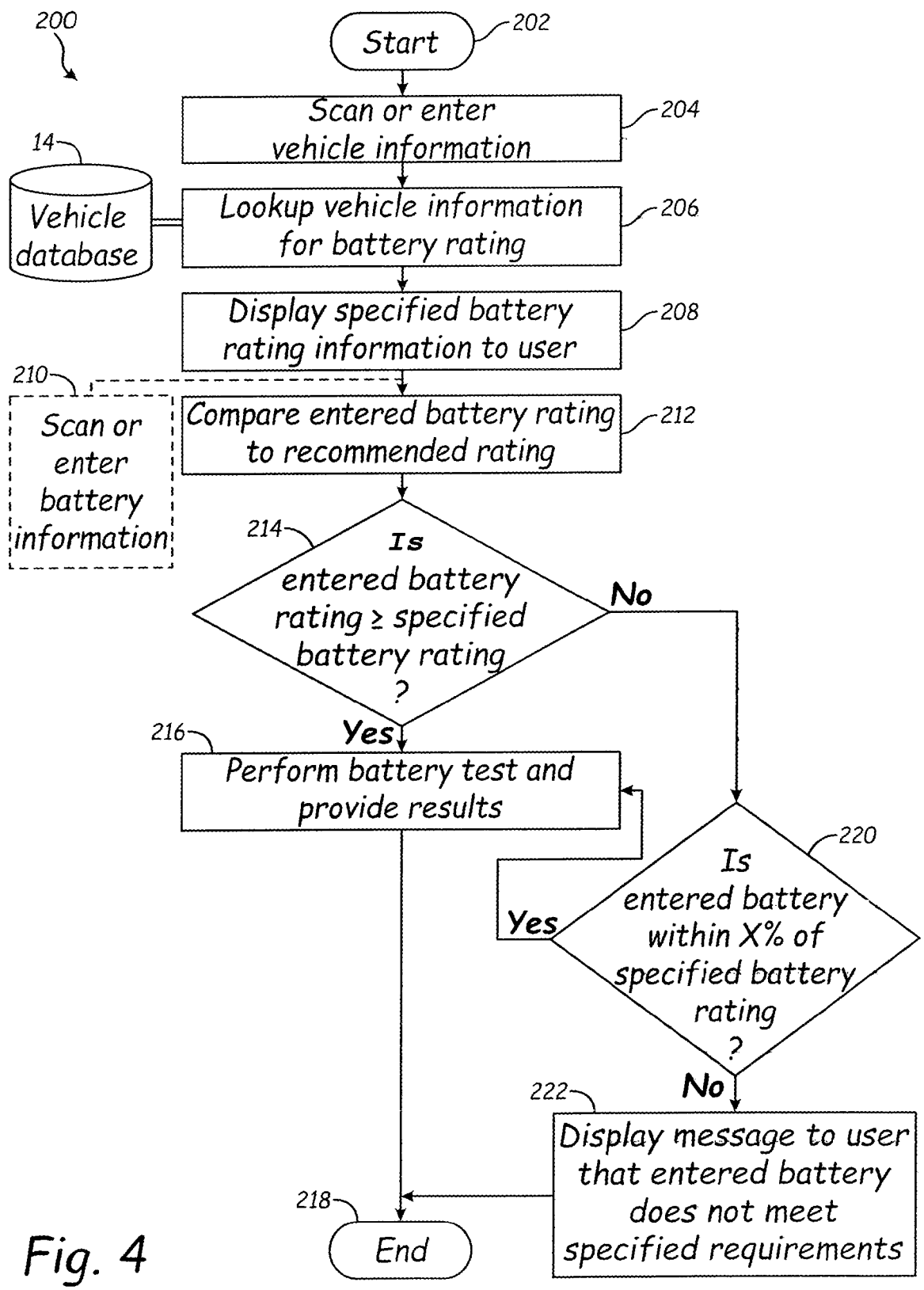
FIG. 4 is a simplified block diagram showing example steps in accordance with one configuration of the present invention.

FIG. 4 shows a block diagram 200 showing exemplary steps in accordance with one configuration of the present invention. In block diagram 200, the procedure is initiated at start block 202. At block 204 vehicle information is retrieved. This information can be retrieved through manual entry, by reading information from a databus of the vehicle, using an optical scanner such as a bar code scanner or camera to scan a VIN of the vehicle. At block 206 the vehicle information is used to look up a recommended battery rating for the particular vehicle. This can be, for example, using a vehicle database 14 having which carries information related to suitable batteries for specific vehicles. After retrieving this information, at block 208 the specified battery rating information can be provided to a user and a display of the battery maintenance device. An optional step 210 includes scanning or otherwise entering battery information. This can be by scanning a bar code or other information carried on a battery using an optical scanner or camera or can be through a manual entry. At block 212, the entered battery rating is compared to the recommended rating. This comparison can be by an operator or can be performed internally to the battery maintenance device and the result displayed or otherwise provided to the operator.

At block 214, if the entered battery rating is equal to (or better than) the specified battery rating, control is passed to block 216 and a battery test is performed and the results provided to the operator. The procedure stops at end block 218. However, if the entered battery rating is less than the specified battery rating, control is passed to comparison block 220. At block 220 if the entered battery rating information is within a desired percentage of the specified battery rating, control is passed to block 216 and a battery test is performed. Alternatively, at block 222 a message is provided to an operator that the entered battery does not meet the specified requirements and a different battery can be chosen.

One specific example is as follows:

1. In the case where the rating of the battery installed in the vehicle does not match the rating of the OEM (Original Equipment Manufacturer) specification (independent of the measurement & test result).
2. Obtain the battery specification rating via VIN input method.
3. Compare this rating with a rating which the user separately inputs.
4. Example:
   a. User obtains the VIN from the vehicle, and inputs the VIN into the battery tester
   b. Battery tester database looks up the original equipment rating of the battery per the VIN input
   c. Tester UI displays this rating to the user
   d. User observes the label of the battery installed in the vehicle is different
   e. User inputs the different, labeled rating, which is different than the OE rating (or scans the UPC to obtain the rating information)
   f. OE rating, for example, is 500 CCA
   g. Battery label rating is 400 CCA
5. In this case, no test has yet been performed, so the battery test or result is not relevant.
6. The user input results in a delta between what the original equipment specification is and the installed battery specification.
7. The tester compares the OE spec to the installed battery spec, and will inform the user when it is a greater delta than the predetermined threshold (say, 20%).
8. User will be informed that the battery is undersized for the vehicle (not necessarily underperforming, or a battery which needs to be replaced because of battery health).
9. The battery test result may be a good battery, meeting the labeled specification 100%, however the user would want to inform the customer that their battery should be changed to the appropriate specification.

Various aspects of the invention can be implemented using battery maintenance techniques as shown and described in: U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. Nos. 6,456,045; 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002;

U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,696,819, issued Feb. 24, 20144; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued march 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Pat. No. 8,164,343, issued Apr. 24, 2012; U.S. Pat. No. 8,198,900, issued Jun. 12, 2012; U.S. Pat. No. 8,203,345, issued Jun. 19, 2012; U.S. Pat. No. 8,237,448, issued Aug. 7, 2012; U.S. Pat. No. 8,306,690, issued Nov. 6, 2012; U.S. Pat. No. 8,344,685, issued Jan. 1, 2013; U.S. Pat. No. 8,436,619, issued May 7, 2013; U.S. Pat. No. 8,442,877, issued May 14, 2013; U.S. Pat. No. 8,493,022, issued Jul. 23, 2013; U.S. Pat. No. D687,727, issued Aug. 13, 2013; U.S. Pat. No. 8,513,949, issued Aug. 20, 2013; U.S. Pat. No. 8,674,654, issued Mar. 18, 2014; U.S. Pat. No. 8,674,711, issued Mar. 18, 2014; U.S. Pat. No. 8,704,483, issued Apr. 22, 2014; U.S. Pat. No. 8,738,309, issued May 27, 2014; U.S. Pat. No. 8,754,653, issued Jun. 17, 2014; U.S. Pat. No. 8,872,516, issued Oct. 28, 2014; U.S. Pat. No. 8,872,517, issued Oct. 28, 2014; U.S. Pat. No. 8,958,998, issued Feb. 17, 2015; U.S. Pat. No. 8,963,550, issued Feb. 24, 2015; U.S. Pat. No. 9,018,958, issued Apr. 28, 2015; U.S. Pat. No. 9,052,366, issued Jun. 9, 2015; U.S. Pat. No. 9,201,120, issued Dec. 1, 2015; U.S. Pat. No. 9,229,062, issued Jan. 5, 20126; U.S. Pat. No. 9,244,100, issued Jan. 26, 2016; U.S. Pat. No. 9,274,157, issued Mar. 1, 2016; U.S. Pat. No. 9,312,575, issued Apr. 12, 2016; U.S. Pat. No. 9,335,362, issued May 10, 2016; U.S. Pat. No. 9,425,487, issued Aug. 23, 2016; U.S. Pat. No. 9,419,311, issued Aug. 16, 2016; U.S. Pat. No. 9,496,720, issued Nov. 15, 2016; U.S. Pat. No. 9,588,185, issued Mar. 7, 2017; U.S. Pat. No. 9,923,289, issued Mar. 20, 2018; U.S. Pat. No. 9,966,676, issued May 8, 2018; U.S. Pat. No. 10,046,649, issued Aug. 14, 2018; U.S. Pat. No. 10,222,397, issued Mar. 5, 2019; U.S. Pat. No. 10,317,468, issued Jun. 11, 2019; U.S. Pat. No. 10,429,449, issued Oct. 1, 2019; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/263,473, filed Oct. 2, 2002, entitled ELECTRONIC BATTERY TESTER WITH RELATIVE TEST OUTPUT; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 11/356,443, filed Feb. 16, 2006, entitled ELECTRONIC BATTERY TESTER WITH NETWORK COMMUNICATION; U.S. Ser. No. 12/697,485, filed Feb. 1, 2010, entitled ELECTRONIC BATTERY TESTER; U.S. Ser. No. 12/769,911, filed Apr. 29, 2010, entitled STATIONARY BATTERY TESTER; U.S. Ser. No. 13/098,661, filed May 2, 2011, entitled METHOD AND APPARATUS FOR MEASURING A PARAMETER OF A VEHICLE ELECTRICAL SYSTEM; U.S. Ser. No. 13/152,711, filed Jun. 3, 2011, entitled BATTERY PACK MAINTENANCE FOR ELECTRIC VEHICLE; U.S. Ser. No. 14/039,746, filed Sep. 27, 2013, entitled BATTERY PACK MAINTENANCE FOR ELECTRIC VEHICLE; U.S. Ser. No. 14/565,689, filed Dec. 10, 2014, entitled BATTERY TESTER AND BATTERY REGISTRATION TOOL; U.S. Ser. No. 14/799,120, filed Jul. 14, 2015, entitled AUTOMOTIVE MAINTENANCE SYSTEM; U.S. Ser. No. 15/017,887, filed Feb. 8, 2016, entitled METHOD AND APPARATUS FOR MEASURING A PARAMETER OF A VEHICLE ELECTRICAL SYSTEM; U.S. Ser. No. 15/049,483, filed Feb. 22, 2016, entitled BATTERY TESTER FOR ELECTRIC VEHICLE; U.S. Ser. No. 15/077,975, filed Mar. 23, 2016, entitled BATTERY MAINTENANCE SYSTEM; U.S. Ser. No. 15/140,820, filed Apr. 28, 2016, entitled CALIBRATION AND PROGRAMMING OF IN-VEHICLE BATTERY SENSOR; U.S. Ser. No. 15/149,579, filed May 9, 2016, entitled BATTERY TESTER FOR ELECTRIC VEHICLE; U.S. Ser. No. 15/634,491, filed Jun. 27, 2017, entitled BATTERY CLAMP; U.S. Ser. No. 15/791,772, field Oct. 24, 2017, entitled ELECTRICAL LOAD FOR ELECTRONIC BATTERY TESTER AND ELECTRONIC BATTERY TESTER INCLUDING SUCH ELECTRICAL LOAD; U.S. Ser. No. 16/021,538, filed Jun. 28, 2018, entitled BATTERY PACK MAINTENANCE FOR ELECTRIC VEHICLE; U.S. Ser. No. 16/056,991, filed Aug. 7, 2018, entitled HYBRID AND ELECTRIC VEHICLE BATTERY PACK MAINTENANCE DEVICE, U.S. Ser. No. 16/253,526, filed Jan. 22, 2019, entitled HIGH CAPACITY BATTERY BALANCER; U.S. Ser. No. 16/253,549, filed Jan. 22, 2019, entitled HYBRID AND ELECTRIC VEHICLE BATTERY PACK MAINTENANCE DEVICE; U.S. Ser. No. 16/297,975, filed Mar. 11, 2019, entitled HIGH USE BATTERY PACK MAINTENANCE; all of which are incorporated herein by reference in their entireties.

Although the present invention has been described with reference to preferred embodiments, workers skilled in the art will recognize that changes may be made in form and detail without departing from the spirit and scope of the invention. For example, any type of battery test or battery charge circuitry can be used by battery tester 10. Further, the databus 12 can be in accordance with any databus technique and should not be limited to the examples set forth herein. In various embodiments, vehicle 15 comprises a vehicle having only internal combustion engine, an electric vehicle, or a hybrid vehicle using both electric and combustion power. Typically, the circuitry 10 is separate from the vehicle 15. For example, the circuitry 10 can be embodied in a portable battery tester or charger. As used herein "battery maintenance device" refers generally to element 10 or variations thereof, and comprises a battery tester, a battery charger, or a device which is both a battery tester and a battery charger. Thus, circuitry 10 provides a battery maintenance device and includes generally battery maintenance circuitry such as circuitry 100 shown in FIG. 3.

What is claimed is:

1. An automotive battery tester, comprising:
an automotive vehicle identification input configured to receive automotive vehicle identification information related to an automotive vehicle which operates using a battery under test;
a battery identification input configured to receive information related to a rating of the battery under test;
an automotive vehicle battery rating database containing a plurality of automotive vehicle identifications each associated with a battery rating requirement for a particular automotive vehicle;
battery test circuitry configured to couple to the battery under test and perform a battery test on the battery under test;
a display;
a microprocessor configured to:
retrieve the battery rating requirement from the automotive vehicle battery rating database based upon the received automotive vehicle identification information;
compare the retrieved battery rating requirement with the rating of the battery under test;
display an output on the display if the rating of the battery under test is less than the retrieved battery rating requirement by a predetermined amount;
perform a battery test on the battery under test using the battery test circuitry if the rating of the battery test is not less than the retrieved battery rating requirement by the predetermined amount; and
display a result of the battery test on the display.

2. The automotive battery tester of claim 1 wherein the microprocessor is further configured to compare the battery test result with the retrieved battery rating requirement and display a result of the comparison on the display.

3. The automotive battery tester of claim 1 wherein the vehicle identification input comprises a manual input.

4. The automotive battery tester of claim 1 wherein the vehicle identification input comprises a scanner.

5. The automotive battery tester of claim 1 wherein the received information related to an automotive vehicle which operates using the battery under test comprises a VIN code.

6. The automotive battery tester of claim 1 wherein the automotive vehicle identification input comprises a databus input configured to connect to a databus of the automotive vehicle.

7. The automotive battery tester of claim 6 wherein information related to operation of the vehicle is retrieved through the databus input.

8. The automotive battery tester of claim 7 wherein the information related to operation of the vehicle comprises a number of times an engine of the vehicle has been started.

9. The automotive battery tester of claim 1 wherein the output displayed on the display if the rating of the battery under test is less than the retrieved battery rating requirement by a predetermined amount provides an indication that the battery is undersized for the automotive vehicle.

10. The automotive battery tester of claim 1 wherein the automotive vehicle identification information comprises a vehicle year, a vehicle make and a vehicle model.

11. The automotive battery tester of claim 1 wherein the automotive vehicle battery rating database is contained in a memory of the automotive battery tester.

12. The automotive battery tester of claim 1 wherein the automotive vehicle battery rating database is located at a remote location.

13. The automotive battery tester of claim 6 wherein diagnostic information in the automotive vehicle is set using the databus input.

\* \* \* \* \*